United States Patent
Fukuzumi et al.

(10) Patent No.: US 9,129,679 B2
(45) Date of Patent: Sep. 8, 2015

(54) SHIFT REGISTER TYPE MAGNETIC MEMORY

(71) Applicant: Kabushiki Kaisha Toshiba, Tokyo (JP)

(72) Inventors: Yoshiaki Fukuzumi, Yokohama (JP); Hideaki Aochi, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 395 days.

(21) Appl. No.: 13/750,085

(22) Filed: Jan. 25, 2013

(65) Prior Publication Data

US 2014/0063893 A1 Mar. 6, 2014

Related U.S. Application Data

(60) Provisional application No. 61/697,081, filed on Sep. 5, 2012.

(51) Int. Cl.

| | |
|---|---|
| *G11C 19/00* | (2006.01) |
| *G11C 19/02* | (2006.01) |
| *G11C 19/08* | (2006.01) |
| *H01L 27/22* | (2006.01) |
| *H01L 43/02* | (2006.01) |
| *B82Y 10/00* | (2011.01) |
| *B82Y 30/00* | (2011.01) |
| *G11C 11/16* | (2006.01) |
| *G11C 21/00* | (2006.01) |

(52) U.S. Cl.
CPC ............... *G11C 19/02* (2013.01); *G11C 19/08* (2013.01); *H01L 27/22* (2013.01); *H01L 43/02* (2013.01); *B82Y 10/00* (2013.01); *B82Y 30/00* (2013.01); *G11C 11/16* (2013.01); *G11C 21/00* (2013.01)

(58) Field of Classification Search
CPC ....................................................... G11C 19/00
USPC ................ 365/80, 83, 85, 148, 158, 171, 173
See application file for complete search history.

(56) References Cited

U.S. PATENT DOCUMENTS

| 6,834,005 B1 | 12/2004 | Parkin |
|---|---|---|
| 6,898,132 B2 | 5/2005 | Parkin |

(Continued)

FOREIGN PATENT DOCUMENTS

| JP | 2008-90957 | 4/2008 |
|---|---|---|
| JP | 2011-527485 | 10/2011 |

(Continued)

OTHER PUBLICATIONS

Stuart S. P. Parkin et al, "Magnetic Domain-Wall Racetrack Memory", Science vol. 320, Apr. 11, 2008, pp. 190-194.

*Primary Examiner* — Harry W Byrne
(74) *Attorney, Agent, or Firm* — Oblon, McClelland, Maier & Neustadt, L.L.P.

(57) ABSTRACT

A shift register type magnetic memory according to an embodiment includes: a magnetic nanowire; a magnetic material chain provided in close vicinity to the magnetic nanowire, the magnetic material chain including a plurality of disk-shaped ferromagnetic films arranged along a direction in which the magnetic nanowire extends; a magnetization rotation drive unit configured to rotate and drive magnetization of the plurality of ferromagnetic films; a writing unit configured to write magnetic information into the magnetic nanowire; and a reading unit configured to read magnetic information from the magnetic nanowire.

20 Claims, 19 Drawing Sheets

(56) References Cited

U.S. PATENT DOCUMENTS

| | | |
|---|---|---|
| 6,920,062 B2 | 7/2005 | Parkin |
| 7,031,178 B2 | 4/2006 | Parkin |
| 7,236,386 B2 | 6/2007 | Parkin |
| 7,859,881 B2 | 12/2010 | Iwata et al. |
| 2007/0047156 A1* | 3/2007 | Cowburn et al. ........... 360/324.1 |
| 2008/0253161 A1* | 10/2008 | Parkin et al. .................... 365/80 |
| 2008/0278998 A1* | 11/2008 | Cowburn et al. .............. 365/171 |
| 2009/0103347 A1* | 4/2009 | Parkin et al. .................... 365/80 |
| 2010/0002486 A1 | 1/2010 | Debrosse et al. |
| 2010/0328986 A1* | 12/2010 | Tsai et al. ........................ 365/80 |
| 2011/0267868 A1 | 11/2011 | Fukuzumi et al. |
| 2012/0008362 A1* | 1/2012 | Joseph et al. .................... 365/80 |
| 2013/0020627 A1 | 1/2013 | Fukuzumi et al. |
| 2013/0075918 A1 | 3/2013 | Fukuzumi et al. |

FOREIGN PATENT DOCUMENTS

| | | |
|---|---|---|
| JP | 2011-233206 | 11/2011 |
| JP | 2013-026397 A | 2/2013 |
| JP | 2013-069891 A | 4/2013 |

* cited by examiner (a) DETECTION USING TMR (b) DETECTION USING INDUCED ELECTROMOTIVE FORCE (c) DETECTION USING SPIN WAVE

SHIFT REGISTER TYPE MAGNETIC MEMORY

CROSS-REFERENCE TO RELATED APPLICATION

This application is based upon and claims the benefit of priority from the prior provisional Application 61/697,081 filed on Sep. 5, 2012 in USA, the entire contents of which are incorporated herein by reference.

FIELD

Embodiments described herein relate generally to a shift register type magnetic memory.

BACKGROUND

As a method for achieving to make a capacity of a memory larger, a shift register type magnetic memory is proposed. This method is not a method of providing each memory cell with a storage device, a selection device, and information extraction interconnection as in the conventional semiconductor memory, but a method of transferring storage information to a location of a sensor and an interconnection formed in a determinate place. As a result, there is a possibility that only storage devices can be arranged at a high density and there is a possibility that the memory capacity will increase by leaps and bounds. For increasing the memory capacity, it is not desirable in the shift register type magnetic memory to provide a control electrode every bit. It is necessary to conduct a shift operation of a desired number of bits by exerting some action on the whole bit line.

In shift register type memories proposed until now, the bit shift is conducted by using a current pulse which flows through the shift register. However, it is not easy to conduct bit shift on information of all bits without fail by using the current pulse. Especially in the where information of at least one hundred bits is handled to make a memory capacity larger, the physical length of the shift register also becomes great and a possibility of a false operation is increased by blunting of the current pulse waveform caused by a capacitance or inductance component.

For achieving a shift register type magnetic memory having a large capacity, a highly reliable shift register in which information of each bit is transferred to an adjacent bit without fail by an action on the whole bit line is needed.

DETAILED DESCRIPTION

A shift register type magnetic memory according to an embodiment includes: a magnetic nanowire; a magnetic material chain provided in close vicinity to the magnetic nanowire, the magnetic material chain including a plurality of disk-shaped ferromagnetic films arranged along a direction in which the magnetic nanowire extends; a magnetization rotation drive unit configured to rotate and drive magnetization of the plurality of ferromagnetic films; a writing unit configured to write magnetic information into the magnetic nanowire; and a reading unit configured to read magnetic information from the magnetic nanowire.

Hereafter, embodiments will be described with reference to the drawings.

(First Embodiment)

Figure 1:
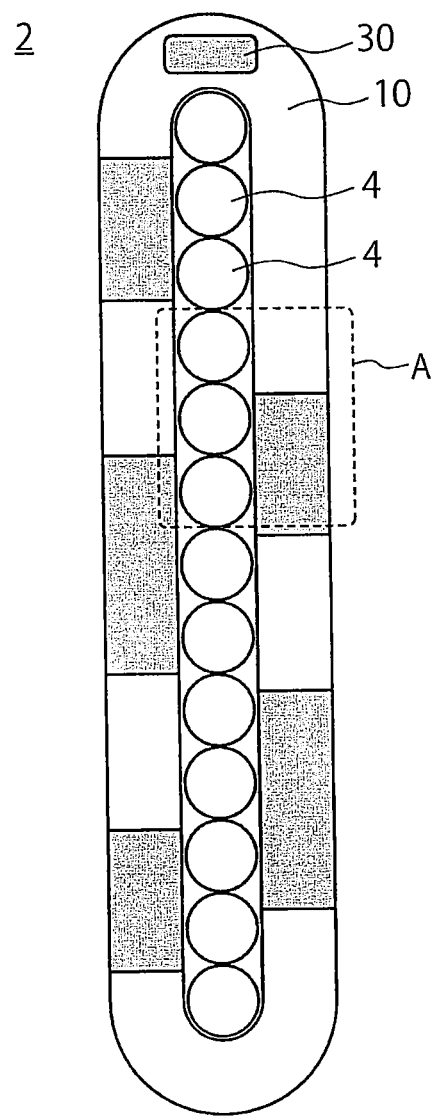
FIG. 1 is a top view showing a shift register type magnetic memory according to a first embodiment.

A shift register type magnetic memory (hereafter referred to as magnetic memory as well) according to a first embodiment is shown in FIG. 1. FIG. 1 is a top view of the magnetic memory according to the first embodiment. The magnetic memory according to the first embodiment includes a magnetic material chain 2 having a plurality of disk-shaped ferromagnetic films 4 arranged in a chain form, a magnetic nanowire 10 provided to surround side faces of the magnetic material chain 2, and a writing and reading unit 30.

The plurality of disk-shaped ferromagnetic films 4 are substantially circular in shape of film face, are formed of, for example, NiFe, and disposed to be nearly in contact with each other. In the present specification, the film face of the ferromagnetic films 4 means the top surface. By the way, the adjacent ferromagnetic films 4 may not be in contact with each other, or may be magnetically coupled to each other with a non-magnetic film which is not illustrated therebetween.

The magnetic nanowire 10 is isolated magnetically from the magnetic material chain 2 with a non-magnetic film of, for example, several nm (not illustrated) between. In the present specification, the magnetic nanowire 10 means a magnetic film having a thickness in the range of 2 nm to 10 nm and a width in the range of 20 nm to 40 nm.

Figure 2:
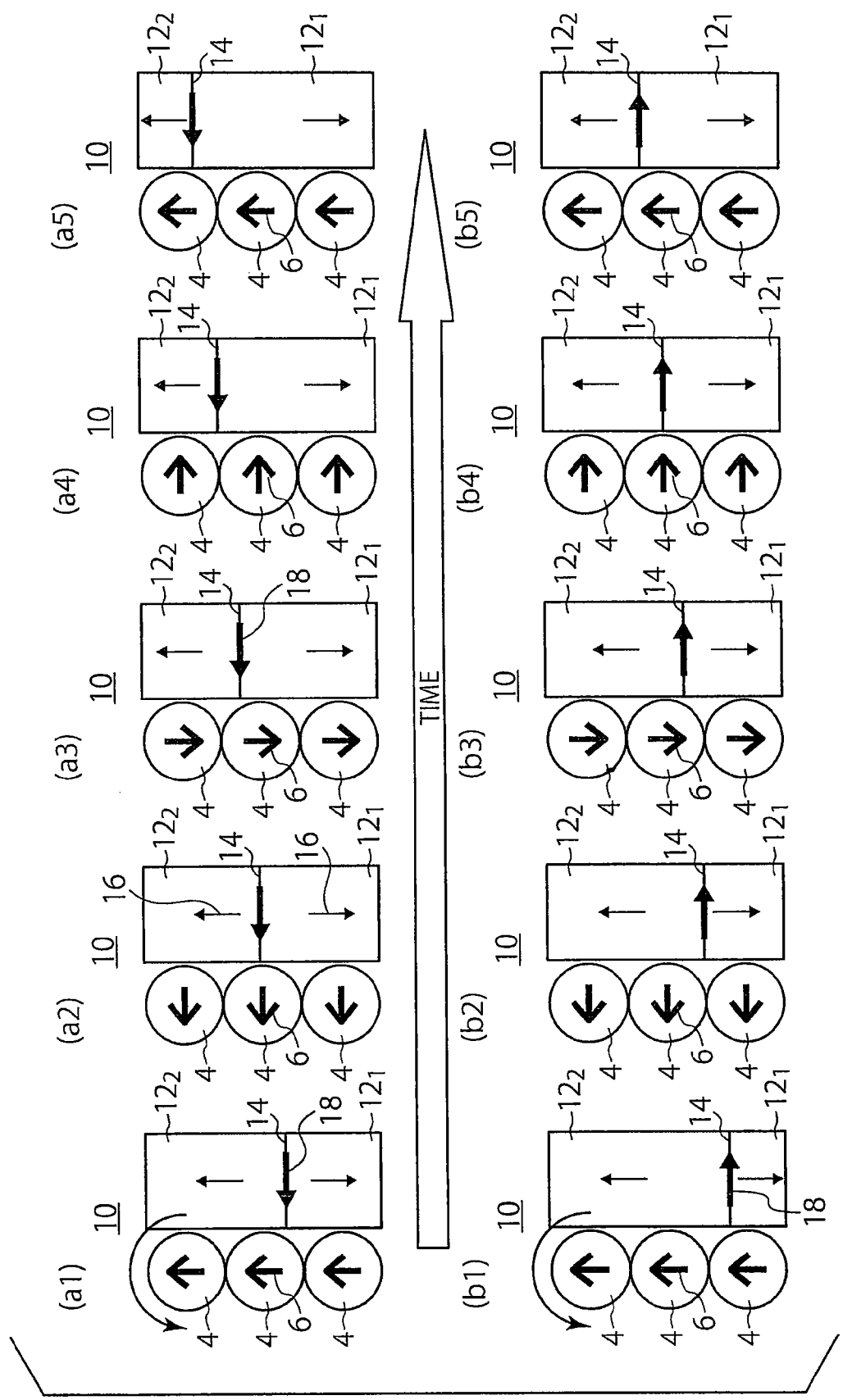
FIGS. 2(a1) to 2(b5) are diagrams for explaining an operation of the shift register type magnetic memory according to the first embodiment.

As shown in FIGS. 2(a1) to 2(b5), magnetic domains $12_1$ and $12_2$ having magnetization 16 which becomes storage information are formed in the magnetic nanowire 10. FIGS. 2(a1) to 2(b5) are enlarged diagrams of a portion A surrounded by a dashed line shown in FIG. 1. Magnetization directions in the magnetic domains $12_1$ and $12_2$ become directions in which the magnetic nanowire 10 extends. Since the magnetic nanowire 10 has a thickness smaller than its width, a direction of magnetization 18 at a magnetic wall 14 formed at a boundary between the adjacent magnetic domains $12_1$ and $12_2$ is apt to become a direction which is in the film face of magnetic nanowire 10 and which is perpendicular to the directions in which the magnetic nanowire 10 extends.

At the magnetic wall 14 of the magnetic nanowire 10, therefore, magnetic poles appear on end faces (side faces) of the magnetic nanowire. As for the magnetic poles at end portions of the magnetic wall 14 of the magnetic nanowire 10, a positive magnetic pole or a negative magnetic pole appears on the side of the magnetic material chain 2 depending upon the sense of magnetization in the magnetic wall 14. FIGS. 2(a1) to 2(a5) show a case where a positive magnetic pole appears, i.e., a case where the directions of lines of magnetic force from a magnetic pole at an end portion of the magnetic wall 14 direct toward the magnetic material chain 2. FIGS. 2(b1) to 2(b5) show a case where a negative magnetic pole appears, i.e., a case where the directions of lines of magnetic force from a magnetic pole at an end portion of the magnetic wall 14 get away from the magnetic material chain 2.

Operations of the magnetic wall in the magnetic nanowire 10 at the time when an operation of causing the magnetization of the magnetic material chain 2 to make a round counterclockwise is conducted will now be described with reference to FIGS. 2(a1) to 2(b5), FIGS. 3(a) and 4.

First, it is supposed that magnetization 6 of each of the plurality of ferromagnetic films 4 included in the magnetic material chain 2 has an upward sense in the drawing in the initial state (FIGS. 2(a1) and 2(b1)). In a state in which film faces of the plurality of ferromagnetic films 4 included in the magnetic material chain 2 take the shape of a true circle and are arranged to be in contact with each other, rotating the magnetization 6 of the ferromagnetic films 4 simultaneously causes the magnetic potential sensed by the magnetic pole in the magnetic wall 14 of the magnetic nanowire 10 to change as shown in FIG. 3(a). As shown in FIG. 3(b), a center of a certain ferromagnetic film 4 in the magnetic material chain 2 is taken as an origin, a direction in which the magnetic material chain 2 extends is taken as a y axis, a direction perpendicular to the extension direction is taken as an x axis, and a radius of the film face of the ferromagnetic films 4 is represented as r. The abscissa axis in FIG. 3(a) indicates a y coordinate of a point on a straight line (represented by a dashed line in FIG. 3(b)) in the magnetic nanowire 10 defined by a straight line x=1.02r, and the ordinate axis indicates the sum of magnetic potentials received from the plurality of ferromagnetic films 4 included in the magnetic material chain 2 on the point. Denoting an angle formed by the direction of the magnetization 6 of the ferromagnetic film 4 and the x axis by θ as shown in FIG. 3(b), simulation results of the magnetic potential in case where θ is 90 degrees, 180 degrees, 270 degrees and 0 degrees are shown in FIG. 3(a).

Since the magnetic walls 14 in the magnetic nanowire 10 are formed in positions which minimize the energy of the system, the magnetic walls 14 are formed in positions which minimize the magnetic potential. The magnetic potential in a case where the angle θ of the magnetization 6 of the ferromagnetic films 4 is 90 degrees in the initial state as shown in FIG. 2(a1) or FIG. 2(b1) is represented by a graph $g_1$ in FIG. 3(a). As appreciated from the graph $g_1$, the magnetic wall 14 in a case where θ is 90 degrees is located in a position where the y coordinate is −0.5r. The magnetic potential obtained when the magnetization 6 of the ferromagnetic films 4 is rotated from the initial state by 90 degrees counterclockwise (FIG. 2(a2) or 2(b2)), i.e., when the angle θ of the magnetization 6 is 180 degrees, is represented by a graph $g_2$ in FIG. 3(a). As appreciated from the graph $g_2$, the magnetic wall 14 in a case where the angle θ of the magnetization 6 is 180 degrees is located in a position where the y coordinate is 0.0. The magnetic potential obtained when the magnetization 6 is rotated from the position of 180 degrees by 90 degrees counterclockwise (FIG. 2(a3) or 2(b3)), i.e., when the angle θ of the magnetization 6 is 270 degrees, is represented by a graph $g_3$ in FIG. 3(a). As appreciated from the graph $g_3$, the magnetic wall 14 in a case where the angle θ of the magnetization 6 is 270 degrees is located in a position where the y coordinate is 0.5r. Furthermore, the magnetic potential obtained when the magnetization 6 is rotated from the position of 270 degrees by 90 degrees counterclockwise (FIG. 2(a4) or 2(b4)), i.e., when the angle θ of the magnetization 6 is 360 degrees (0 degrees), is represented by a graph $g_4$ in FIG. 3(a). As appreciated from the graph $g_4$, the magnetic wall 14 in a case where the angle θ of the magnetization 6 is 0 degrees is located in a position where the y coordinate is r. Furthermore, when the magnetization 6 is rotated from the position of 0 degrees by 90 degrees counterclockwise (FIG. 2(a5) or 2(b5)), i.e., when the angle θ of the magnetization 6 is 90 degrees, is represented by a graph $g_4$ in FIG. 3(a), the magnetic wall 14 is located in a position where the y coordinate is 1.5r.

Figure 3:
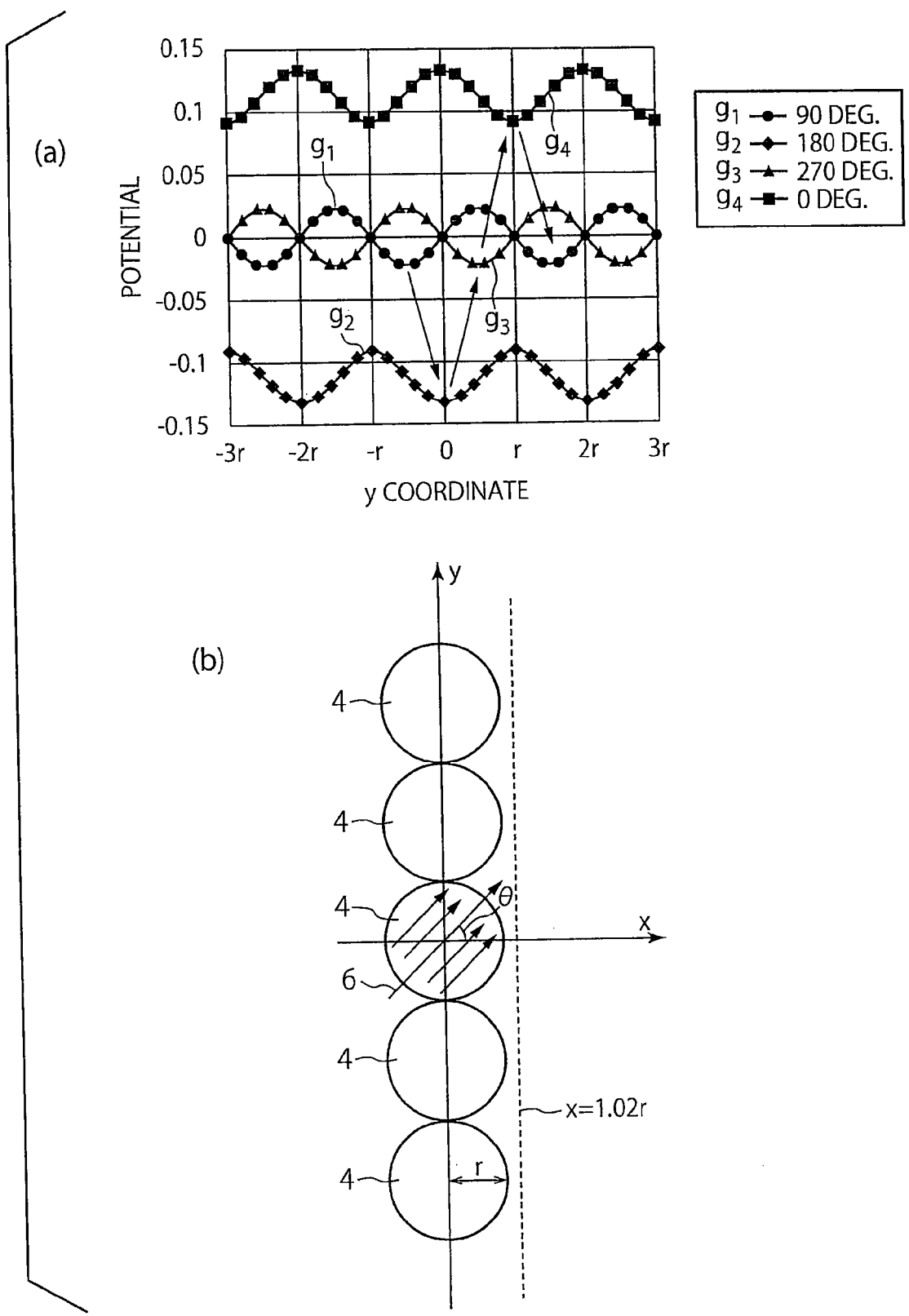
FIGS. 3(a) and 3(b) are diagrams for explaining an operation of the shift register type magnetic memory according to the first embodiment.
Figure 4:
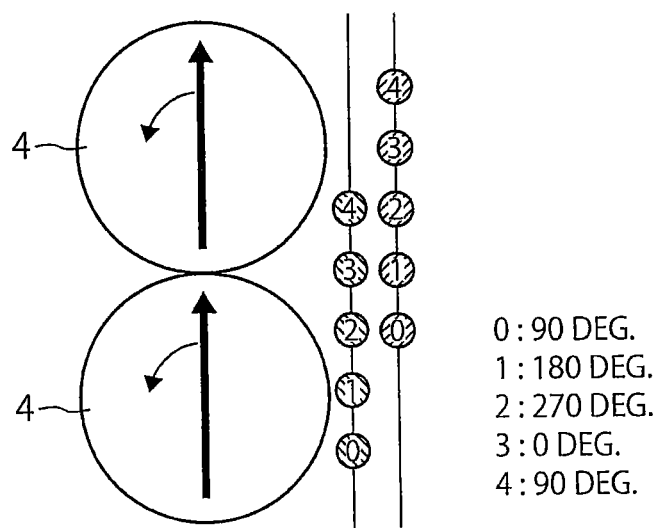
FIG. 4 is a diagram for explaining an operation of the shift register type magnetic memory according to the first embodiment.

While the magnetization of the ferromagnetic films 4 makes a round counterclockwise, therefore, the magnetic wall 14 moves in the positive direction of the y axis as indicated by arrows in FIG. 3(a). The movement distance becomes 2r (=1.5r−(−0.5r)), and the magnetic wall 14 moves by the diameter of the ferromagnetic films 4, i.e., by one ferromagnetic film 4.

In this way, the magnetic pole of the magnetic wall 14 moves to minimize the energy of the system with respect to each rotation angle. Positions where the system energy is minimized (positions where the magnetic potential is minimized) are shown in FIG. 4 as regards the positive magnetic pole and the negative magnetic pole. At this time, the movement direction of the magnetic wall 14 becomes the same no matter whether the magnetic pole of the magnetic wall 14 is positive or negative. In other words, the magnetic wall 14 moves in the positive direction of the y axis. By the way, if the magnetization 6 of the ferromagnetic films 4 rotates clockwise, the magnetic wall 14 moves in an opposite direction, i.e., in the negative direction of the y axis. If the magnetization of the ferromagnetic films 4 included in the magnetic material chain 2 is rotated counterclockwise in the first embodiment shown in FIG. 1, then the magnetic walls 14 in the magnetic nanowire 10 located on the right side of the magnetic material chain 2 move in the positive direction of the y axis whereas the magnetic walls 14 in the magnetic nanowire 10 located on the left side of the magnetic material chain 2 move in the negative direction of the y axis. In the first embodiment shown in FIG. 1, therefore, the magnetic walls 14 in the magnetic nanowire 10 move counterclockwise.

According to the first embodiment, it becomes possible to move the positions of the magnetic walls in the magnetic nanowire 10 by a desired distance by rotating the magnetization of the ferromagnetic films 4 included in the magnetic material chain 2 in this way. As a result, magnetization information in the magnetic nanowire 10 can be transferred by a desired distance certainly. A method for rotating the magnetization of the ferromagnetic films 4 included in the magnetic material chain 2 will be described in detail later.

(Writing and Reading)

Writing information into the magnetic nanowire 10 and reading information from the magnetic nanowire 10 will now be described.

Writing information into the magnetic nanowire 10 is conducted by a writing unit in the writing and reading unit 30 as shown in FIG. 1. A first concrete example of the writing unit is shown in FIGS. 5(a) and 5(b).

(Writing Unit)

Figure 5:
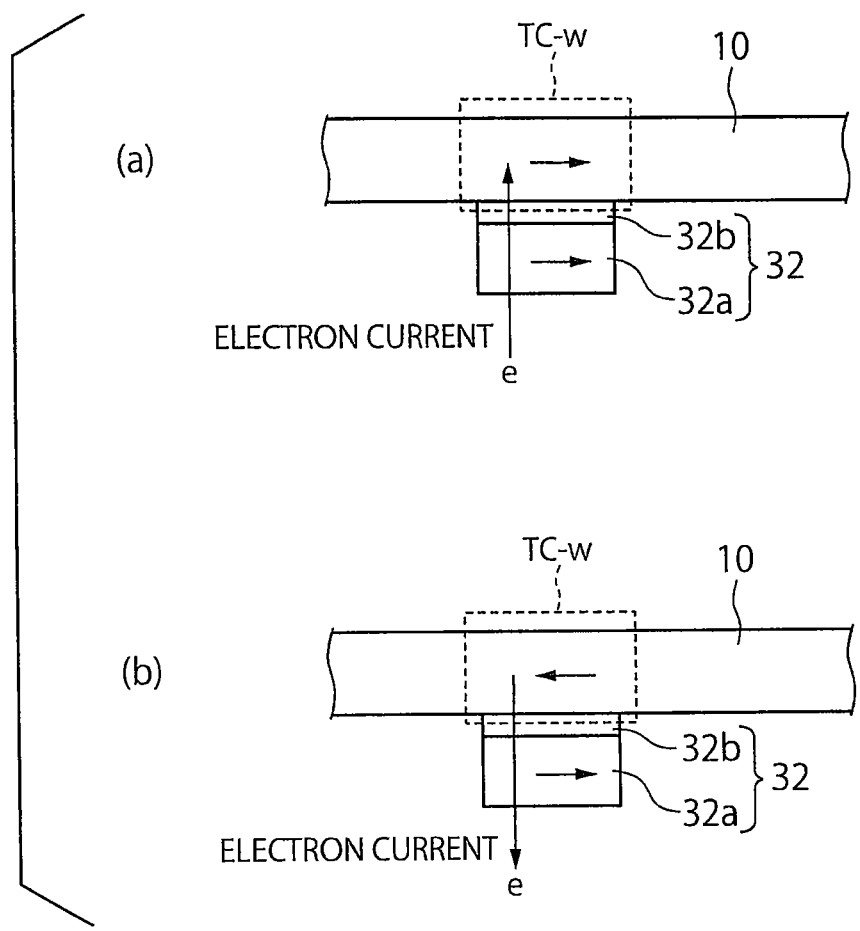
FIGS. 5(a) and 5(b) are diagrams showing a first concrete example of a writing unit.

As shown in FIGS. 5(a) and 5(b), a writing unit 32 is disposed for a part of the magnetic nanowire 10 and data is written by deciding a magnetization direction of a corresponding target cell of the magnetic nanowire 10 (cell in an address to be written in: TC-w). In this writing unit 32, spin transfer torque writing, for example, as shown in FIGS. 5(a) and 5(b) can be used. In FIGS. 5(a) and 5(b), a magnetic electrode 32a is provided to be in contact with the magnetic nanowire 10 via an intermediate layer 32b. The intermediate layer 32b is formed of a non-magnetic metal layer, a non-magnetic semiconductor layer, or a tunnel barrier layer.

The magnetization direction of the magnetic electrode 32a is fixed and it is parallel to a film face of the intermediate layer 32b. By the way, the film face means an interface of the intermediate layer 32b to the magnetic electrode 32a, and it is a face parallel to the direction in which the magnetic nanowire 10 extends. At the time of writing operation, an electron current (opposite in sense to a current) is caused to flow between the magnetic nanowire 10 and the magnetic electrode 32a. Data is written by deciding the magnetization direction of the target cell TC-w according to the direction of the electron current. FIG. 5(a) shows a case where writing is conducted to make the magnetization direction of the target cell TC-w parallel to the magnetization direction of the magnetic electrode 32a, and an electron current is caused to flow from the magnetic electrode 32a to the target cell TC-w in the magnetic nanowire 10 via the intermediate layer 32b. FIG. 5(b) shows a case where writing is conducted to make the magnetization direction of the target cell TC-w anti-parallel to the magnetization direction of the magnetic electrode 32a, and an electron current is caused to flow from the target cell TC-w in the magnetic nanowire 10 to the magnetic electrode 32a via the intermediate layer 32b.

As the non-magnetic metal layer which is the intermediate layer 32b in the spin transfer torque writing unit 32, Cu, Ag, Au, Al or an alloy containing at least one kind out of them can be mentioned. As the tunnel barrier layer, a material such as aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, or $Cr_2O_3$ can be used. As the intermediate layer 32b, a non-magnetic material such as graphite can be used.

For the magnetic electrode 32a in the spin transfer torque writing unit 32, the same material as that of the magnetic nanowire 10 can be used.

In this way, writing can be conducted by the writing unit 32. After writing of magnetization into a certain bit is conducted, magnetization of the ferromagnetic films 4 included in the magnetic material chain 2 is rotated, and the magnetization information of the whole magnetic nanowire 2 is shifted by a desired distance, and then next bit information is written. Magnetization information can be written into the whole magnetic nanowire by repeating the operation.

In FIGS. 5(a) and 5(b), the magnetization direction of the magnetic nanowire 10 is parallel to the extension direction of the magnetic nanowire 10. However, the magnetization direction of the magnetic nanowire 10 may be perpendicular to the extension direction of the magnetic nanowire 10. In this case, the magnetization of the magnetic electrode 32a shown in FIGS. 5(a) and 5(b) becomes perpendicular to the film face.

(Reading Unit)

Reading information from the magnetic nanowire 10 is conducted by a reading unit in the writing and reading unit 30 shown in FIG. 1. First to third concrete examples of the reading unit are shown in FIGS. 6(a), 6(b) and 6(c), respectively.

Figure 6:
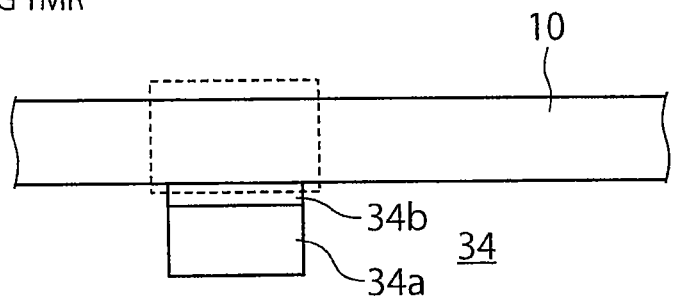
FIGS. 6(a) to 6(c) are diagrams showing first to third concrete examples of a reading unit.
Figure 6:
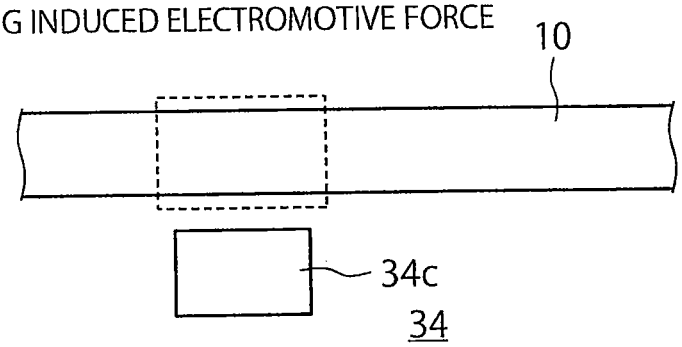
Figure 6:
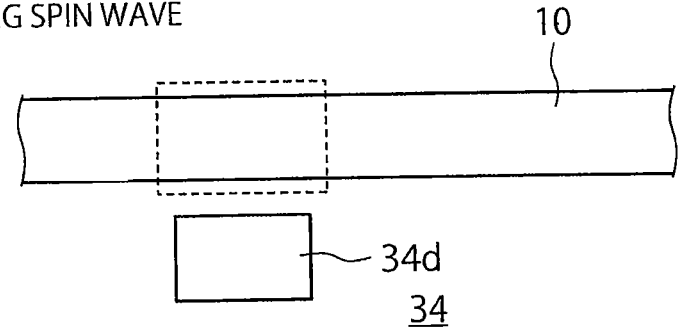

As shown in FIG. 6(a), the magnetization direction of the target cell TC-w which has moved to a position of the magnetic nanowire 10 corresponding to the reading unit 34 is read in the reading unit 34. In the reading unit 34, a structure which reads a signal by means of the tunnel magnetoresistive effect by providing a magnetic electrode 34a in contact with the magnetic nanowire 10 via a tunnel barrier layer 34b as shown in FIG. 6(a) can be used. As the tunnel barrier layer 34b, a material such as aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, or $Cr_2O_3$ can be used. For the magnetic electrode 34a, the same material as that of the magnetic nanowire 10 can be used.

Furthermore, as for the reading unit 34, the magnetization direction of the target cell TC-w can be read by providing a detection line 34c apart from the magnetic nanowire 10, for example, as shown in FIG. 6(b) and using induced electromotive force generated in the detection line 34c when the magnetic walls move. Furthermore, the magnetization direction of the target cell TC-w can be detected as a spin wave signal by providing a spin wave transmission line 34d apart from the magnetic nanowire 10 or in contact with the magnetic nanowire 10 as shown in FIG. 6(c).

In this way, reading can be conducted by the reading unit. Information written in the whole magnetic nanowire can be read by repeating an operation of shifting a predetermined bit to the reading unit and monitoring a resistance value in the same way as the writing operation. In the foregoing description of the writing and reading, a configuration in which a magnetization fixed layer (a magnetic electrode) is located under the magnetic nanowire is shown. However, it is also possible to provide the magnetization fixed layer over or on a side face of the magnetic nanowire.

A method for rotating the magnetization of the ferromagnetic films 4 included in the magnetic material chain 2 will now be described.

The magnetic memory according to the first embodiment further includes a magnetization rotation drive unit to rotate the magnetization of the ferromagnetic films 4 included in the magnetic material chain 2. A first concrete example of the magnetization rotation drive unit is shown in FIGS. 7(a) and 7(b). FIG. 7(a) is a sectional view obtained by cutting the magnetic material chain shown in FIG. 1 with a section taken along the direction in which the ferromagnetic films 4 in the magnetic material chain are arranged in a chain form.

A magnetization rotation drive unit 40 in the first concrete example has a stacked structure obtained by stacking an electrode 41, a piezoelectric material 42, an electrode 43, a piezoelectric material 44 and an electrode 45 in the cited order. In other words, the magnetization rotation drive unit 40 has a structure obtained by sandwiching two piezoelectric materials 42 and 44 among three electrodes 41, 43 and 45. The piezoelectric material 42 and the electrodes 41 and 43 having the piezoelectric material 42 sandwiched between them form a first piezoelectric device. And the piezoelectric material 44 and the electrodes 43 and 45 having the piezoelectric material 44 sandwiched between them form a second piezoelectric device. And the ferromagnetic films 4 included in the magnetic material chain 2 are provided on the electrode 45 in a chain form (FIG. 7(a)). By the way, the magnetic nanowire 10 is provided on the magnetization rotation drive unit 40 in the same way as the magnetic material chain 2. In this case, it is desirable to use a material which is smaller in magnetostriction constant than the ferromagnetic films 4 included in the magnetic material chain 2 as the magnetic material of the magnetic nanowire 10. Owing to such a configuration, the magnetization of the ferromagnetic films 4 included in the magnetic material chain 2 is rotated by the magnetization rotation drive unit 40, but the magnetization of the magnetic nanowire 10 is not rotated by the magnetization rotation drive unit 40. As a result, stable information (magnetization) can be stored.

A stress induced in each of the piezoelectric materials 42 and 44 is changed by applying an electric field to each of them, and a resultant magnetic anisotropy strain is applied to the ferromagnetic films 4. As a result, magnetization of the ferromagnetic films 4 is rotated by the inverse magnetostriction effect of the magnetic material chain 2. Directions 42a and 44a of stresses induced in respective piezoelectric materials 42 and 44 obtained when viewing the piezoelectric materials 42 and 44 from the magnetic material chain 2 side are shown in FIG. 7(b). FIG. 7(b) is top views respectively of the piezoelectric materials 42 and 44 displayed with positions made different from each other. For example, the piezoelectric material 42 orients crystal in the direction 42a obtained by inclining a direction in which the magnetic material chain 2 extends (hereafter referred to as track direction as well) by approximately 60 degrees clockwise, i.e., in a direction of −60 degrees. The piezoelectric material 44 orients crystal in the direction 44a obtained by inclining the track direction by approximately 60 degrees counterclockwise, i.e., in a direction of 60 degrees. If in this case an electric field is applied to the piezoelectric material 42 by using the electrodes 41 and 43, a stress is induced in the piezoelectric material 42 in the orientation direction 42a. Furthermore, if an electric field is applied to the piezoelectric material 44 by using the electrodes 43 and 45, a stress is induced in the piezoelectric material 44 in the orientation direction 44a.

Figure 8:
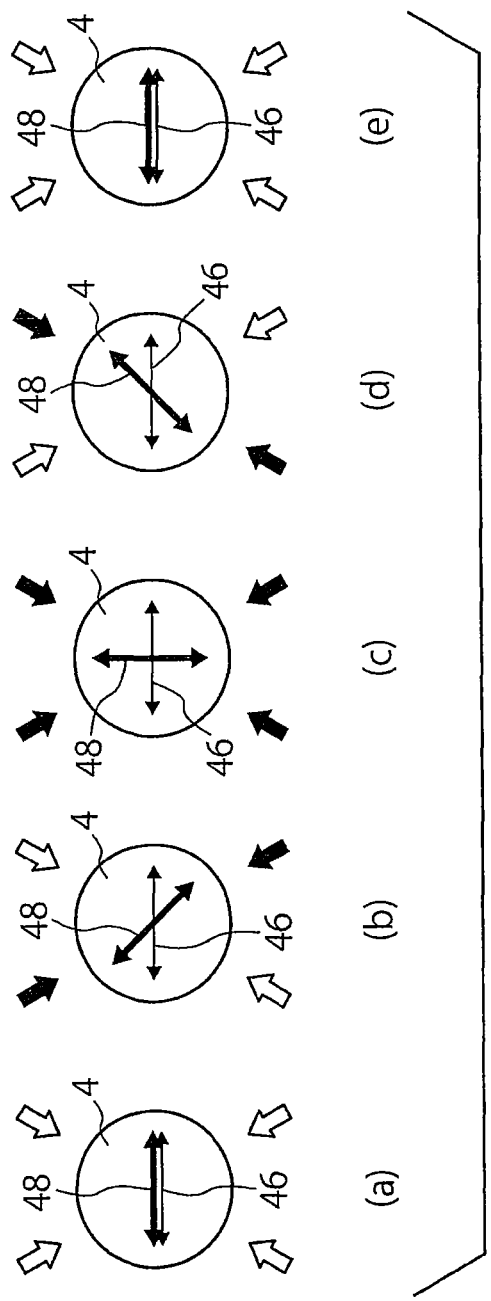
FIGS. 8(a) to 8(e) are diagrams for explaining rotation of magnetization driven by the magnetization rotation drive unit of the first concrete example.

Rotation of the magnetization of the ferromagnetic films 4 caused by the magnetization rotation drive unit 40 will now be described with reference to FIGS. 8(a) to 8(e). First, as shown in FIG. 8(a), in the initial state, the axis of easy magnetization (for example, crystal magnetic anisotropy) of the ferromagnetic films 4 is in a direction (track direction) indicated by reference numeral 46. Therefore, a synthesized magnetic anisotropy (magnetization direction of the ferromagnetic films 4) in the case where a voltage is not applied to the electrodes 41, 43 and 45 is also in the same track direction. By the way, in FIGS. 8(a) to 8(e), white arrows disposed in four slant directions around the ferromagnetic films 4 indicate that no voltage is applied to the piezoelectric materials 42 and 44. Black arrows disposed in four slant directions around the ferromagnetic films 4 indicate that a voltage is applied to the piezoelectric materials 42 and 44. Left upper and right lower arrows concern the piezoelectric material 42. Left lower and right upper arrows concern the piezoelectric material 44. In FIG. 8(a), a voltage is applied to neither the piezoelectric material 42 nor 44 and consequently white arrows are indicated.

If in this state, for example, the electrode 43 is fixed to 0 V and a voltage is applied to the electrode 41, as shown in FIG. 8(b), then a stress in −60 degree direction is applied to the ferromagnetic films 4 in the magnetic material chain 2 by the piezoelectric material 42. As a result, a synthesized magnetic anisotropy 48, i.e., a magnetization direction 48 in the ferromagnetic films 4 rotates by −60 degrees as compared with the case of FIG. 8(a).

If in this state a voltage is further applied to the electrode 45 as well, as shown in FIG. 8(c), then a stress in a +60 degree direction is applied to the ferromagnetic films 4 by the piezoelectric material 44. Therefore, a stress in a direction of approximately 90 degrees is applied to the ferromagnetic films 4 as a synthetic stress (synthesized magnetic anisotropy 48). As a result, the synthesized magnetic anisotropy 48, i.e., the magnetization direction 48 in the ferromagnetic films 4 rotates by −30 degrees as compared with the state shown in FIG. 8(b), and is in a direction inclined by 90 degrees from the track direction (FIG. 8(c)).

Then, the voltage applied to the electrode 41 is returned to 0 V as shown in FIG. 8(d). Only the stress caused by the piezoelectric material 44 remains. The ferromagnetic films 4 sense a stress in the +60 degree direction, and the magnetization direction 48 of the ferromagnetic films 4 rotates by −30 degrees as compared with the state in FIG. 8(c).

Furthermore, the voltage applied to the electrode 45 is also returned to 0 V, as shown in FIG. 8(e). As a result, the stress acting on the ferromagnetic films 4 returns to the zero state, and the magnetization direction 48 of the ferromagnetic films 4 rotates by −60 degrees as compared with the state in FIG. 8(d). Eventually, the magnetization direction 48 rotates by 180 degrees as compared with the state shown in FIG. 8(a).

Figure 7:
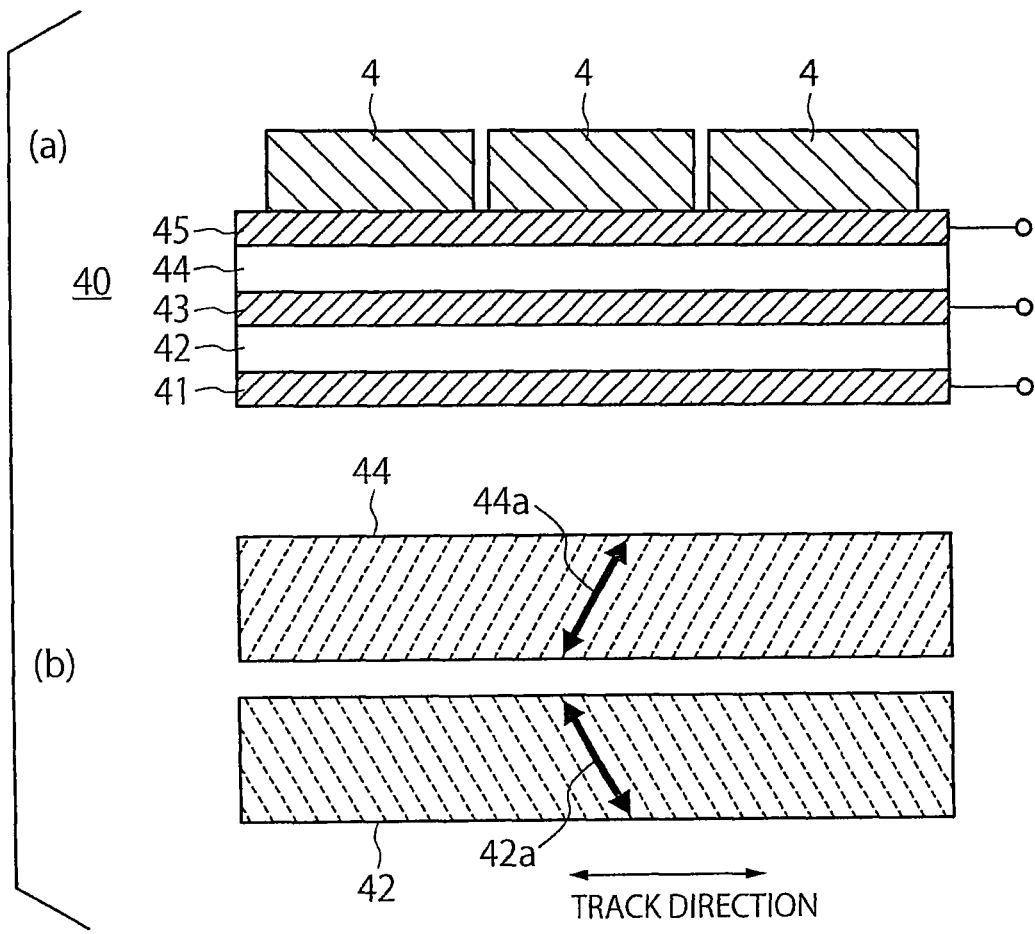
FIGS. 7(a) and 7(b) are diagrams showing a first concrete example of a magnetization rotation drive unit.

If the ferromagnetic films 4 have a finite magnetostriction constant in this way, then magnetization of the ferromagnetic films 4 can be caused to make half revolution by the stress caused to make half revolution through the series of processes. By the way, the ferromagnetic films 4 in the magnetic material chain 2 driven by the magnetization rotation drive unit 40 in the first concrete example may not be in contact with each other as shown in FIG. 7 or may be in contact with each other as shown in FIG. 1.

In the magnetization rotation drive unit 40 in the first concrete example, the first piezoelectric device formed of the piezoelectric material 42 and the electrodes 41 and 43 having the piezoelectric material 42 sandwiched between them applies a stress in a direction obtained by rotating the axis of easy magnetization of the ferromagnetic films 4 in the magnetic material chain 2 by 60 degrees clockwise. And the second piezoelectric device formed of the piezoelectric material 44 and the electrodes 43 and 45 having the piezoelectric material 44 sandwiched between them applies a stress, in a direction obtained by rotating the axis of easy magnetization of the ferromagnetic films 4 in the magnetic material chain 2 by 60 degrees counterclockwise. Even if the first piezoelectric device applies a stress in a direction obtained by rotating the axis of easy magnetization of the ferromagnetic films 4 in the magnetic material chain 2 by an angle in the range of 50 to 80 degrees clockwise and the second piezoelectric device applies a stress in a direction obtained by rotating the axis of easy magnetization of the ferromagnetic films 4 in the magnetic material chain 2 by an angle in the range of 50 to 80 degrees counterclockwise, the magnetization of the ferromagnetic films 4 in the magnetic material chain 2 can be rotated.

A second concrete example of the magnetization rotation drive unit which rotates the magnetization of the ferromagnetic films 4 included in the magnetic material chain 2 will now be described with reference to FIGS. 9(a) to 9(e). A magnetization rotation drive unit 50 in the second concrete example includes magnetic material members 52 and 54 connected to an end portion of the magnetic material chain 2 and magnetized respectively in directions of, for example, 45 degrees and 225 degrees with respect to the track direction. A current is caused to flow through the plurality of ferromagnetic films 4 included in the magnetic material chain via these magnetic material members 52 and 54. As a result, the so-called magnetic wall movement occurs in the plurality of ferromagnetic films 4, and eventually magnetization of the individual ferromagnetic film 4 can be caused to make one revolution. The plurality of ferromagnetic films 4 included in the magnetic material chain 2 driven by the magnetization rotation drive unit 50 in the second concrete example may be in direct contact with each other, or may not be in contact with each other. If the ferromagnetic films 4 included in the magnetic material chain 2 are not in direct contact with each other, then it is possible to rotate the magnetization of the disk-shaped magnetic materials in the magnetic material chain by providing a magnetic material interconnection which is contact with the magnetic material chain 2 and which is parallel to the magnetic material chain 2, magnetically coupling respective disk-shaped magnetic materials to the magnetic material interconnection, and causing to flow a through current through the magnetic material interconnection.

Figure 9:
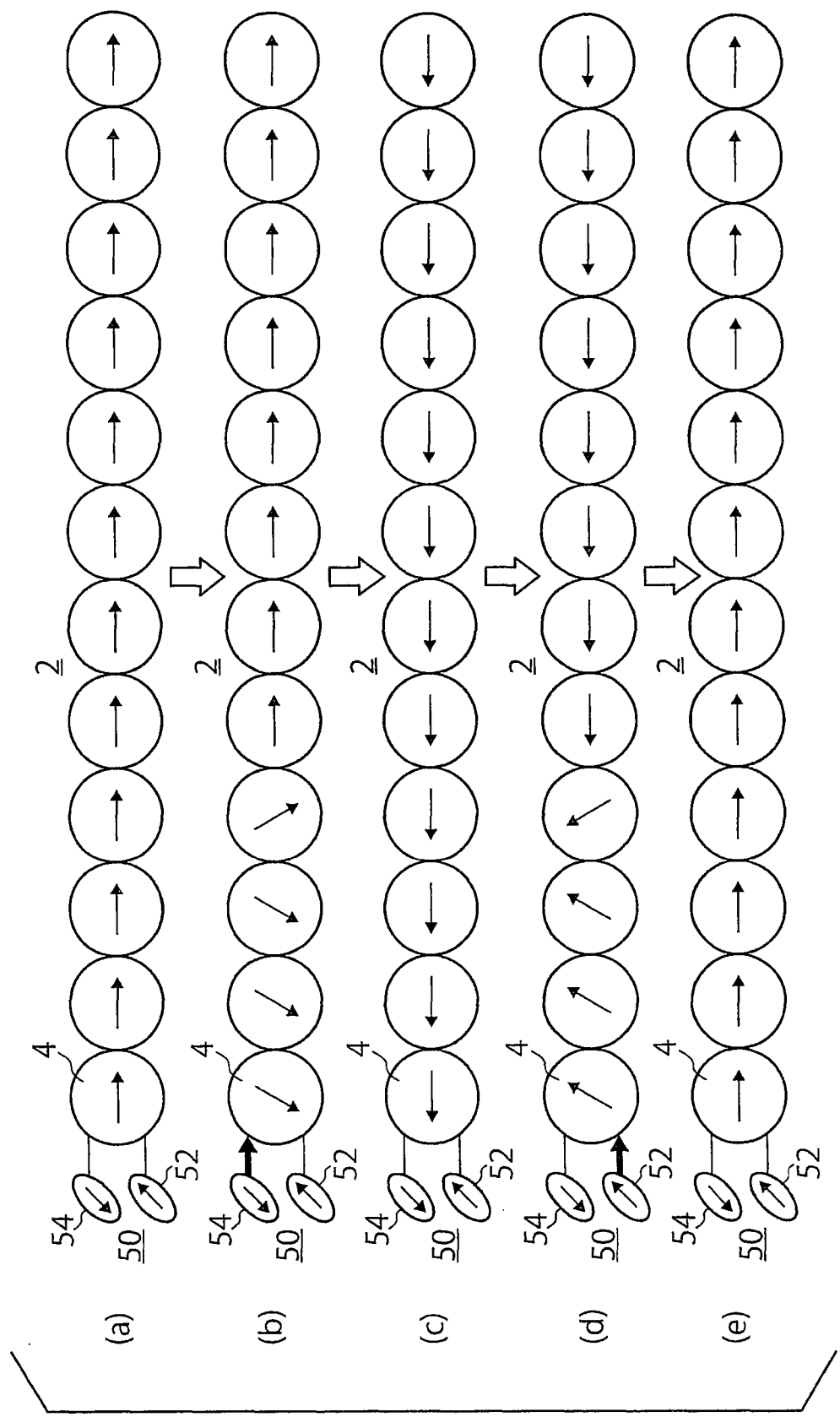
FIGS. 9(a) to 9(e) are diagrams for explaining rotation of magnetization driven by the magnetization rotation drive unit of a second concrete example.
Figure 10:
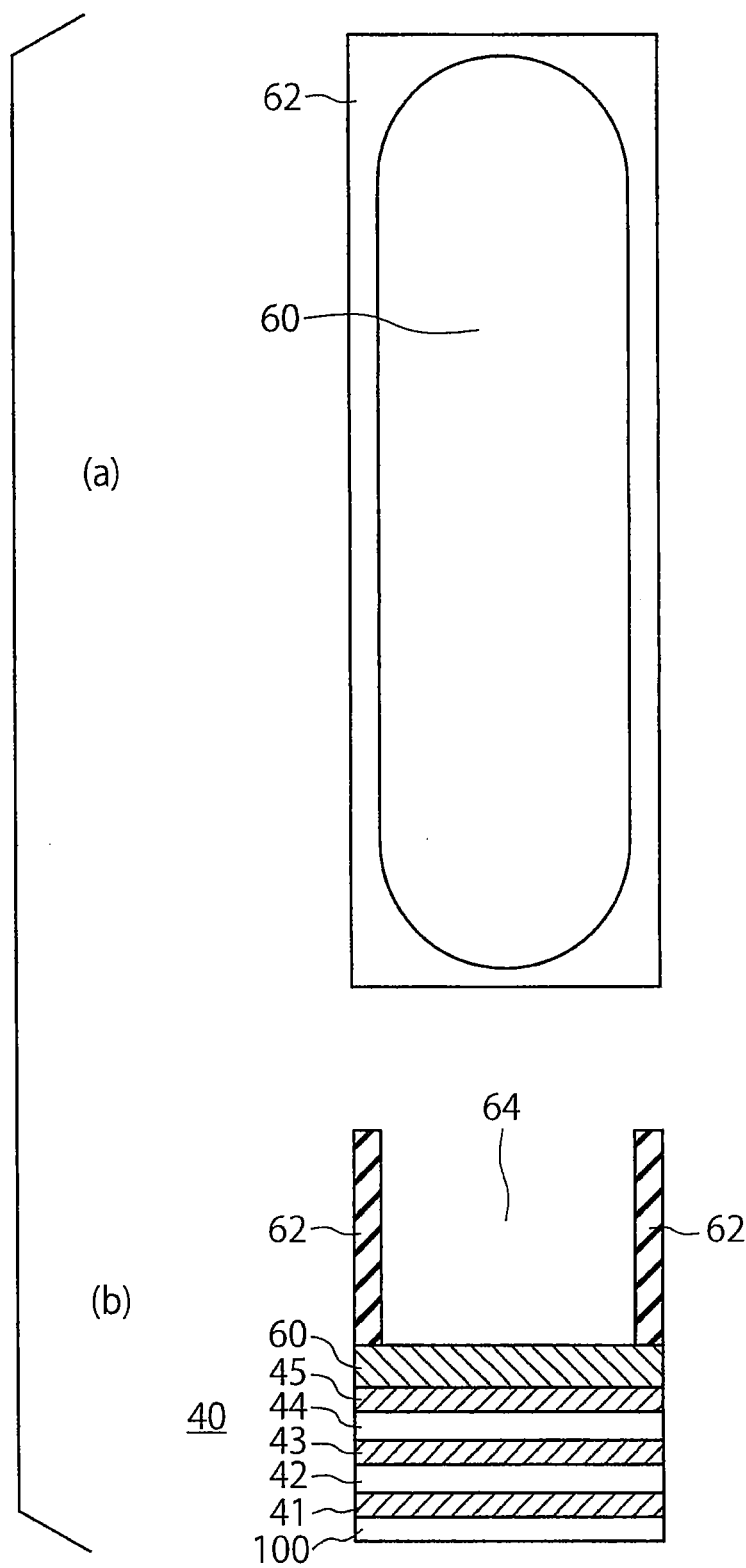
FIGS. 10(a) and 10(b) are diagrams for explaining a manufacturing method of the magnetic memory according to the first embodiment.
Figure 11:
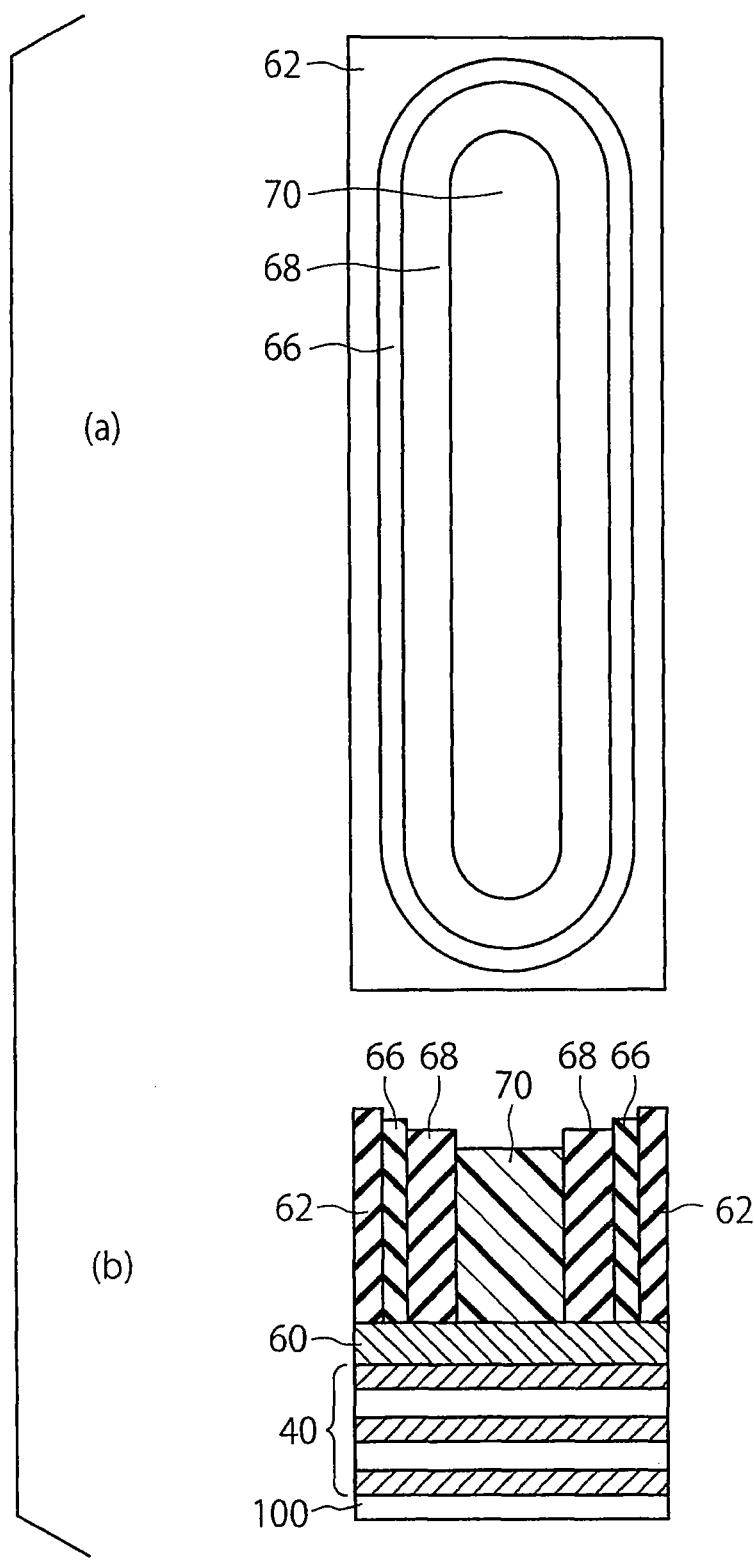
FIGS. 11(a) and 11(b) are diagrams for explaining a manufacturing method of the magnetic memory according to the first embodiment.
Figure 12:
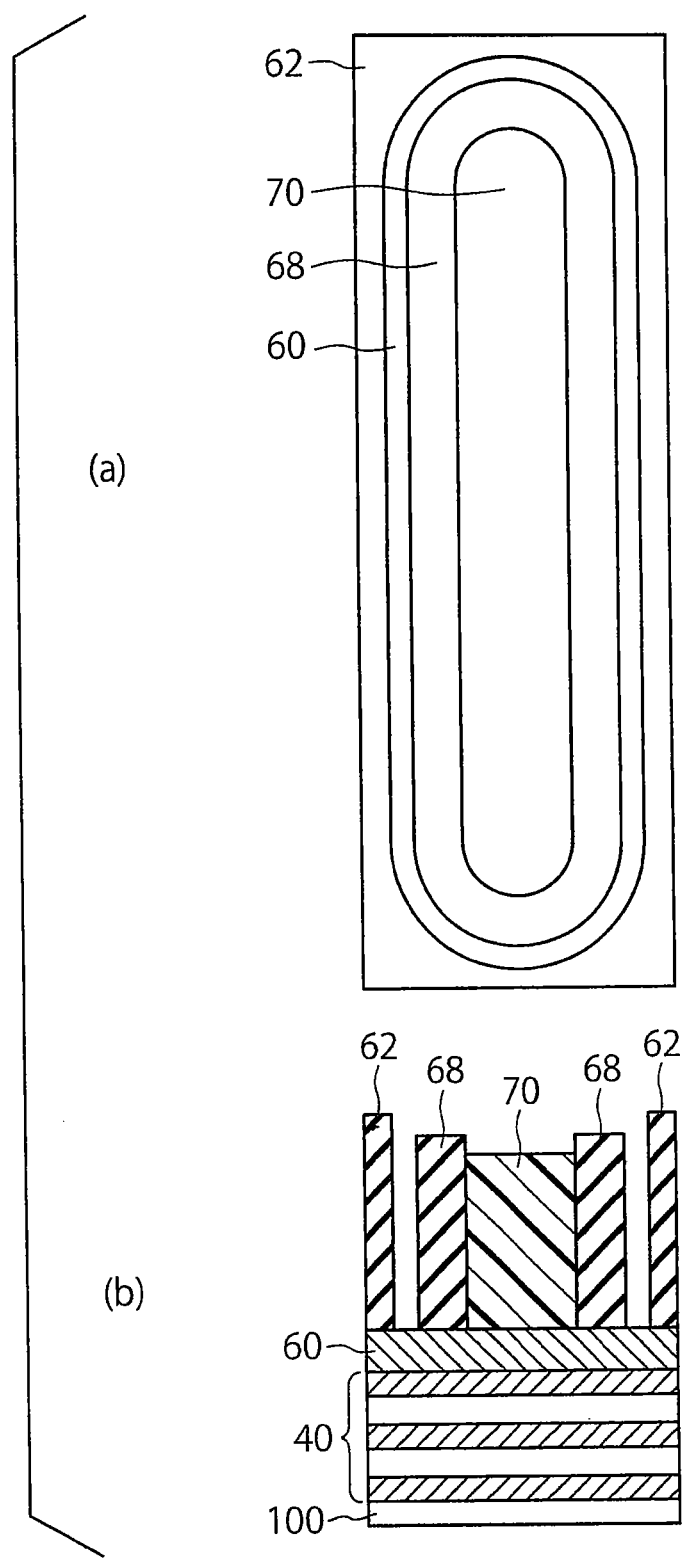
FIGS. 12(a) and 12(b) are diagrams for explaining a manufacturing method of the magnetic memory according to the first embodiment.
Figure 13:
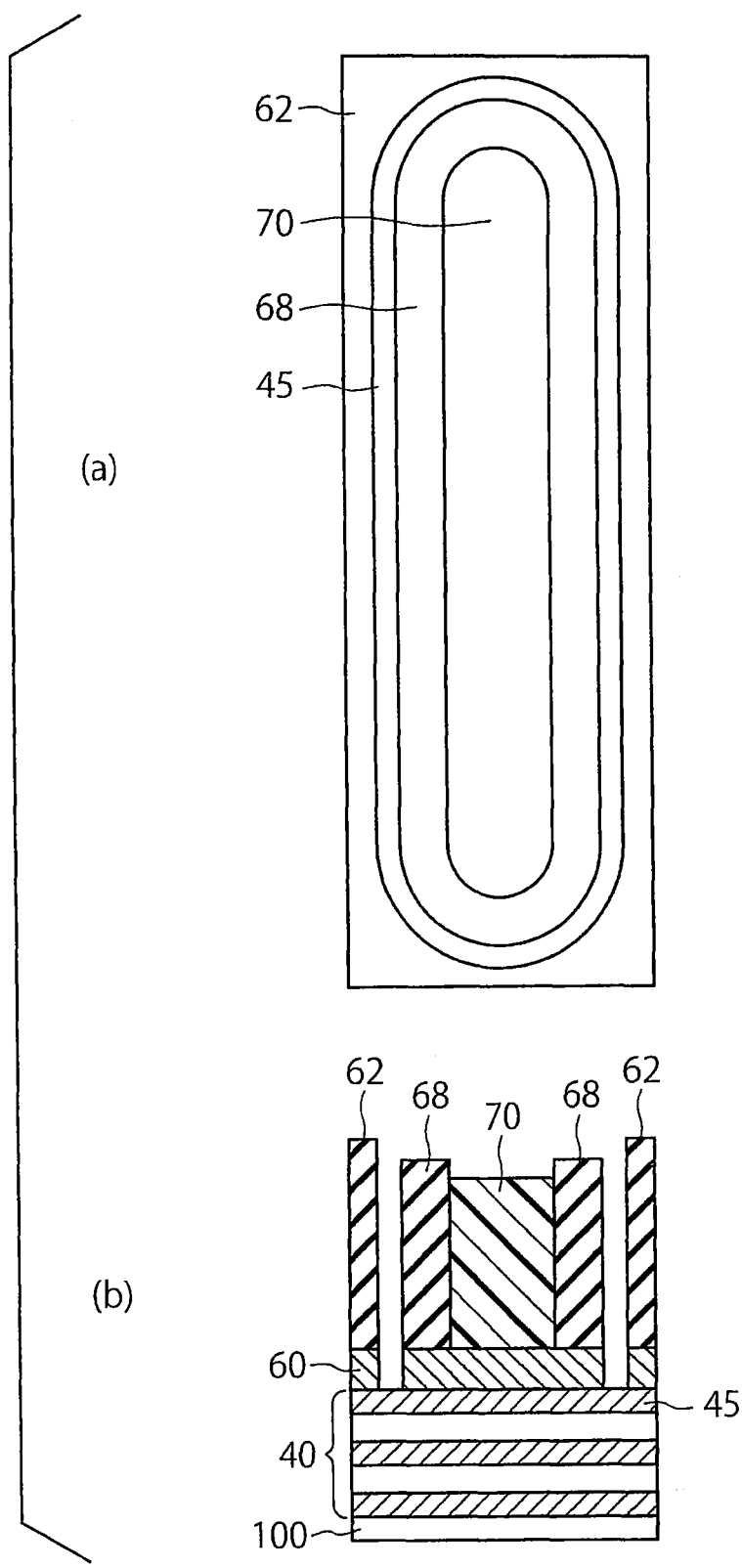
FIGS. 13(a) and 13(b) are diagrams for explaining a manufacturing method of the magnetic memory according to the first embodiment.
Figure 14:
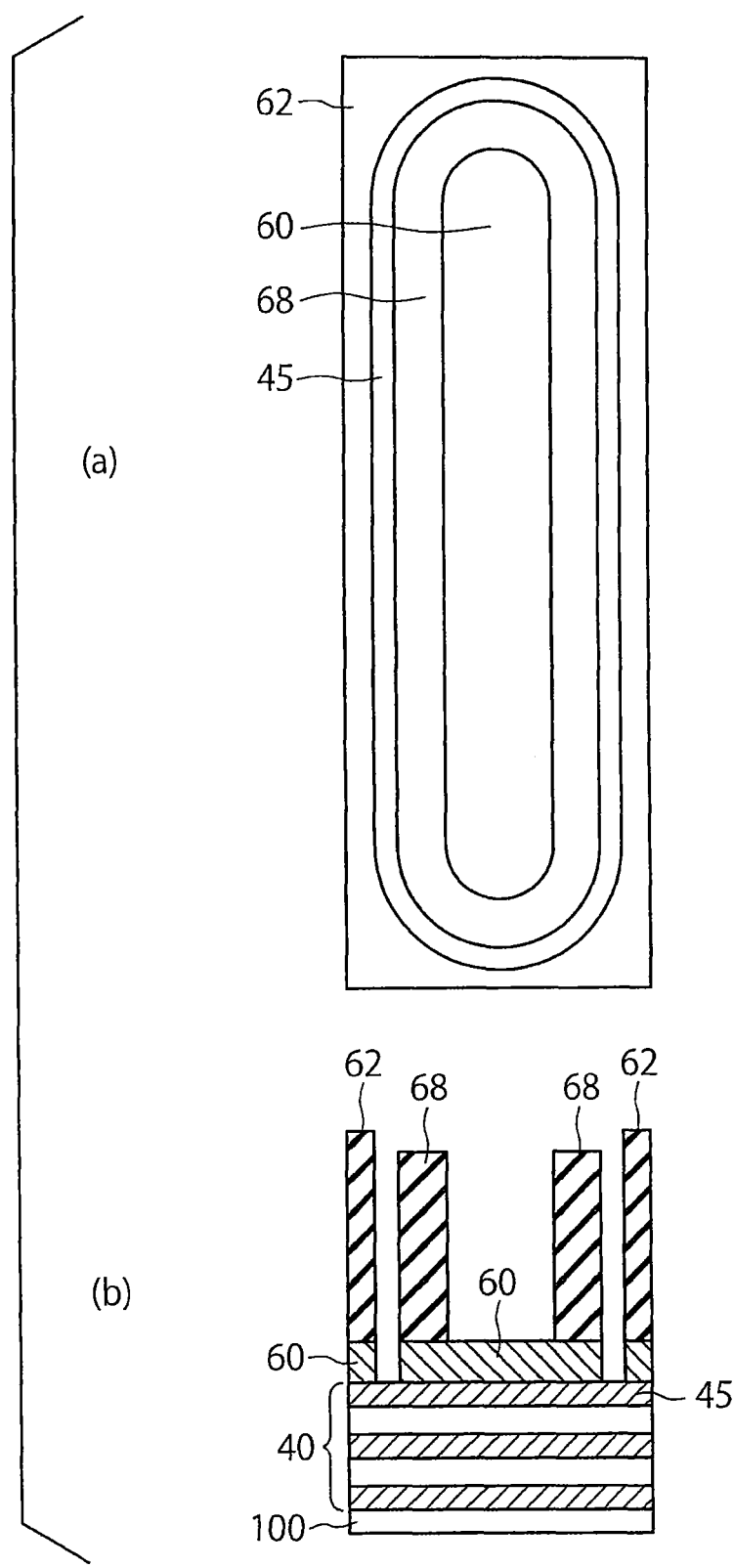
FIGS. 14(a) and 14(b) are diagrams for explaining a manufacturing method of the magnetic memory according to the first embodiment.
Figure 15:
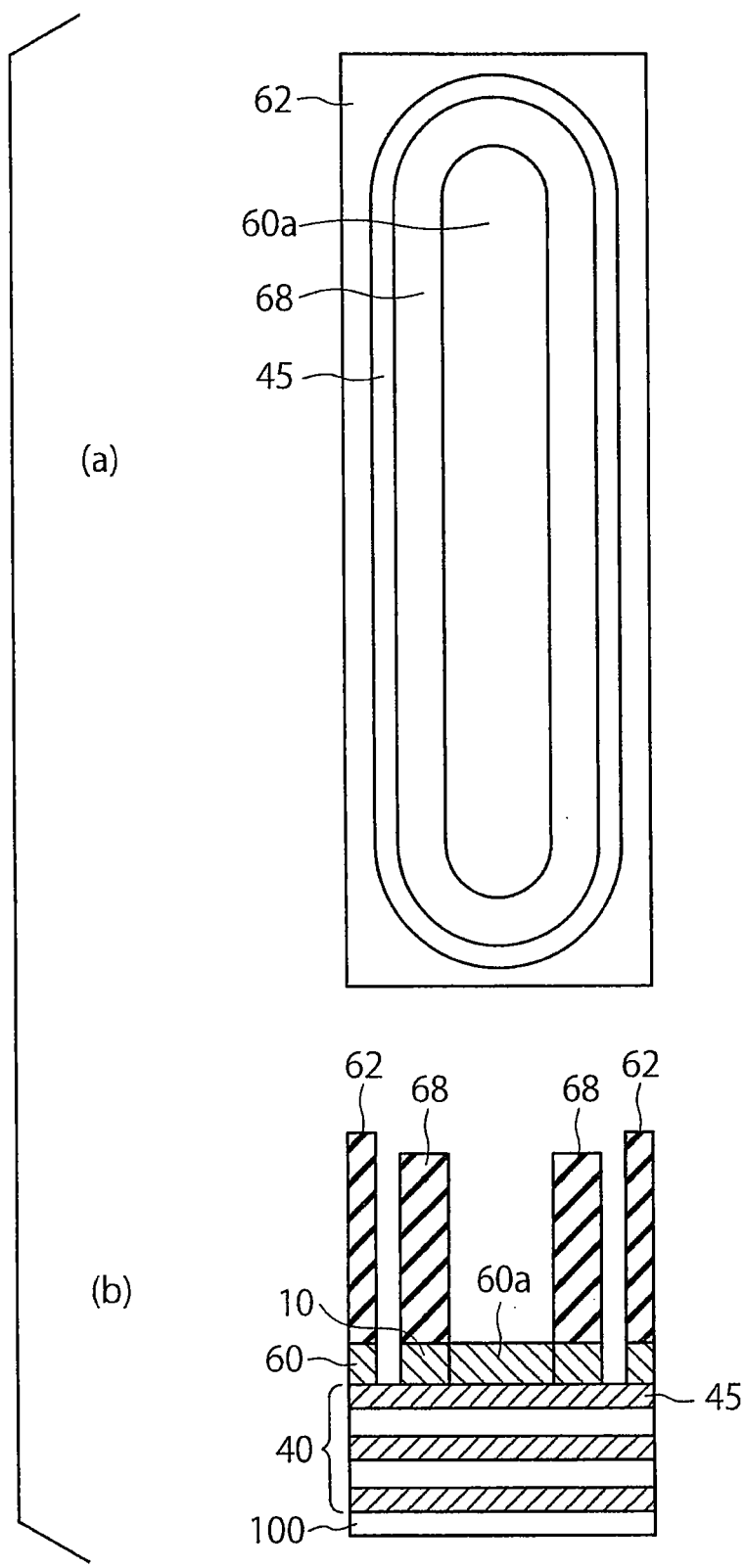
FIGS. 15(a) and 15(b) are diagrams for explaining a manufacturing method of the magnetic memory according to the first embodiment.
Figure 16:
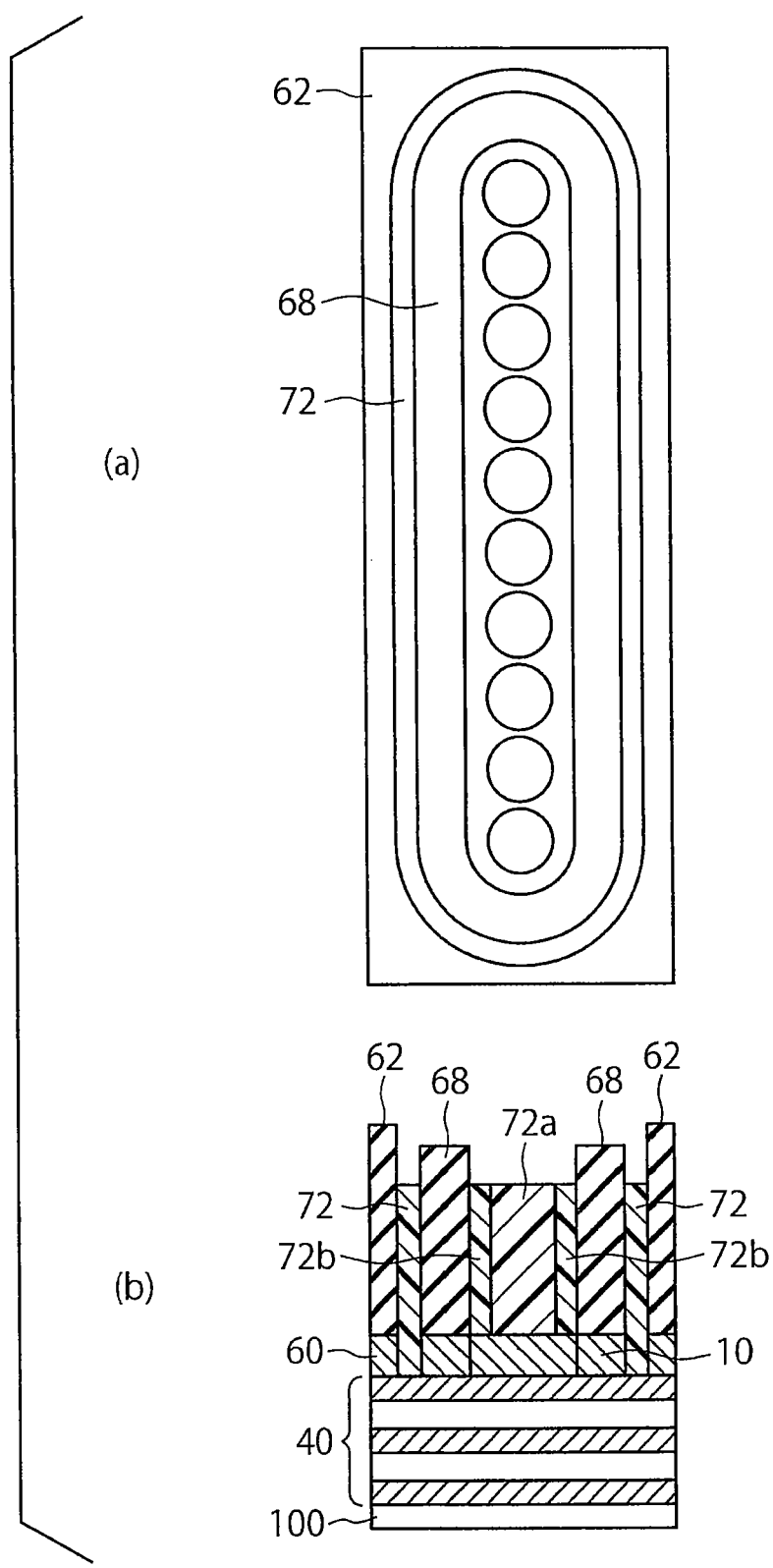
FIGS. 16(a) and 16(b) are diagrams for explaining a manufacturing method of the magnetic memory according to the first embodiment.
Figure 17:
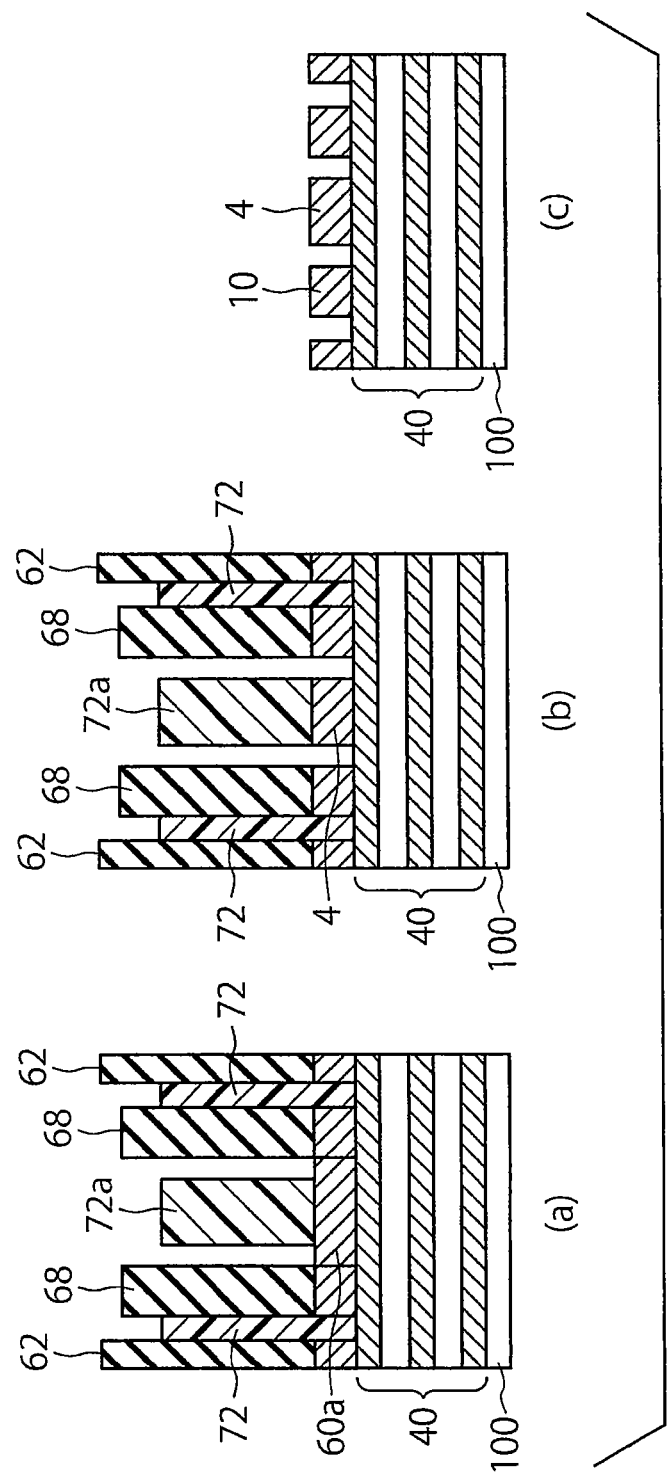
FIGS. 17(a) to 17(c) are diagrams for explaining a manufacturing method of the magnetic memory according to the first embodiment.
Figure 18:
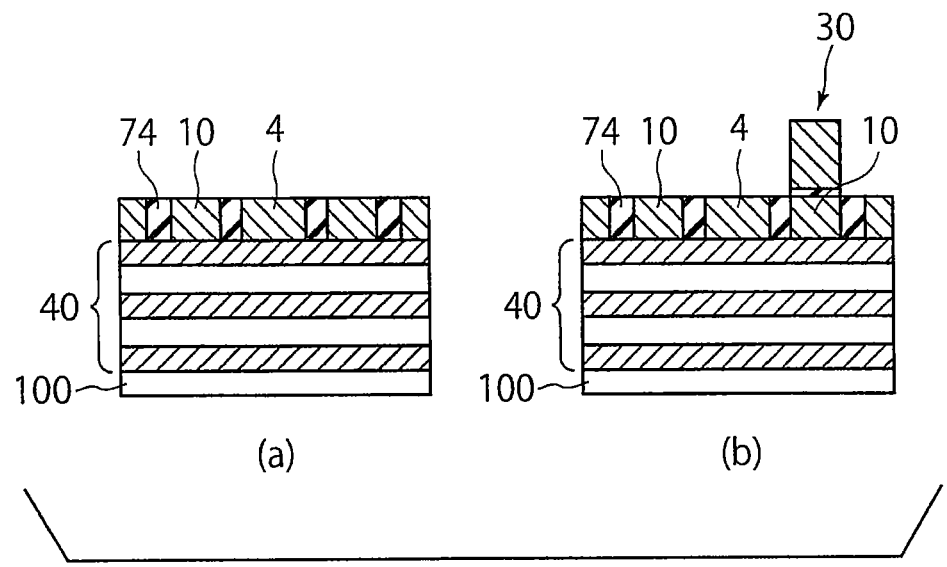
FIGS. 18(a) and 18(b) are diagrams for explaining a manufacturing method of the magnetic memory according to the first embodiment.

First, it is supposed that in the initial state the magnetization of the ferromagnetic films 4 is in 0 degree as shown in FIG. 9(a). If in this state a current is caused to flow into the magnetic material chain 2 through the magnetic material member 54 having magnetization in the direction of 225 degrees as shown in FIG. 9(b), then rotation of the magnetization of the ferromagnetic films 4 is caused in the magnetic material chain 2 by the spin torque transfer effect. In this case, magnetization rotates clockwise. And if the current is interrupted, then the magnetization assumes a direction of 180 degrees in order to settle down in the original axis of easy magnetization direction (0 degrees) of the ferromagnetic films 4 (FIG. 9(c)).

If a current is caused to flow into the magnetic material chain 2 through the magnetic material member 52 having magnetization in the direction of 45 degrees in the state shown in FIG. 9(c), then rotation of magnetization of the ferromagnetic films 4 is caused in the magnetic material chain 2 by the spin torque transfer effect. In this case, the magnetization rotates clockwise (FIG. 9(d)). And if the current is interrupted, then the magnetization assumes a direction of 0 degrees in order to settle down in the original axis of easy magnetization direction (0 degrees) of the ferromagnetic films 4 (FIG. 9(e)).

Owing to the operation described heretofore, the magnetization of the plurality of ferromagnetic films 4 included in the magnetic material chain 2 can be caused to make one revolution.

(Manufacturing Method)

A manufacturing method of the magnetic memory in the first embodiment will now be described with reference to FIGS. 10(a) to 19. FIGS. 10(a) to 19 are explanation diagrams showing manufacturing processes of the magnetic memory in the first embodiment. This manufacturing method is a manufacturing method of a magnetic memory including the magnetization rotation drive unit in the first concrete example shown in FIG. 7. By the way, FIGS. 10(a), 11(a), 12(a), 13(a), 14(a), 15(a) and 16(a) are plane views. FIGS. 10(b), 11(b), 12(b), 13(b), 14(b), 15(b), 16(b), and FIGS. 17(a) to 19 are sectional views.

First, a stacked structure of the magnetization rotation drive unit 40 is formed on a substrate 100 having a peripheral circuit formed thereon. In other words, as shown in FIGS. 10(a) and 10(b), the electrode 41, the piezoelectric material 42, the electrode 43, the piezoelectric material 44, and the electrode 45 are stacked over the substrate 100 in the cited order. Subsequently, a magnetic film 60 which becomes the magnetic nanowire 10 is deposited on the electrode 45, and an insulation film 62 is deposited on the magnetic film 60. Thereafter, an oval-shaped opening 64 is provided in the insulation film 62 (FIGS. 10(a) and 10(b)).

Then, a first side wall material, for example, a silicon nitride film is deposited to bury the opening 64. RIE (Reactive Ion Etching) is conducted on the silicon nitride film, and a first side wall 66 formed of a silicon nitride film is formed on a side face of the opening 64. Subsequently, a second side wall material, for example, a BSG (Boron Doped Silicate Glass) film is deposited. A second side wall 68 formed of a BSG film is formed by conducting RIE on the BSG film. Thereafter, a BSG film 70 is buried in a region where the magnetic material chain 2 is to be formed (FIGS. 11(a) and 11(b)).

Then, the silicon nitride film which is the first side wall 66 is removed selectively in, for example, a heated phosphoric acid solution. After the silicon nitride film 66 is removed, an opening is formed. And the surface of the magnetic film 60 is exposed at a bottom portion of the opening (FIGS. 12(a) and 12(b)).

Then, the magnetic film 60 is etched by ion milling, and the surface of the electrode 45 is exposed at a bottom face (FIGS. 13(a) and 13(b)). Subsequently, the BSG film is peeled off by conducting etching in an HF vapor atmosphere, and the surface of the magnetic film 60 in the region where the magnetic material chain 2 is to be formed is exposed (FIGS. 14(a) and 14(b)).

Then, the exposed magnetic film 60 in the region where the magnetic material chain 2 is to be formed is plated to increase the magnetostriction constant of the magnetic film 60a in the plated region (FIGS. 15(a) and 15(b)). At this time, the magnetic film 60 under the second side wall 68 which is not plated becomes the magnetic nanowire 10.

Then, a diblock polymer film 72 is applied. Subsequently, bake processing is conducted to phase-isolate the diblock polymer film 72 to polymer 72a which becomes a cylindrical mask on the magnetic film 60a and polymer 72b located around the polymer 72a. At this time, the space between the insulation film 62 and the second side wall 68 is narrow. Therefore, phase isolation is not caused in the diblock polymer film 72 applied to this space (FIGS. 16(a) and 16(b)).

Then, development is conducted and the polymer 72b is removed as shown in FIG. 17(a). Subsequently, the magnetic film 60a is patterned by using the mask 72a, and the ferromagnetic films 4 arranged in a chain form are formed (FIG. 17(b)). Then, the mask 72a, the second side wall 68, the diblock polymer film 72, and the insulation film 62 are removed (FIG. 17(c)).

Then, a non-magnetic insulation film 74 is deposited to cover the ferroelectric film 4 and the magnetic nanowire 10. Subsequently, the insulation film 74 is etched back to planarize the surface of the insulation film 74 and expose top faces of the ferromagnetic film 4 and the magnetic nanowire 10 (FIG. 18(a)). Subsequently, the writing and reading unit 30 is formed over a region where there is the magnetic nanowire 10 (FIG. 18(b)). In the drawing, a configuration having a magnetization fixed layer located over the magnetic nanowire is supposed. As the writing and reading unit 30, for example, the writing unit shown in FIGS. 5(a) and 5(b) and the reading unit shown in one of FIGS. 6(a) to 6(c) can be used.

Figure 19:
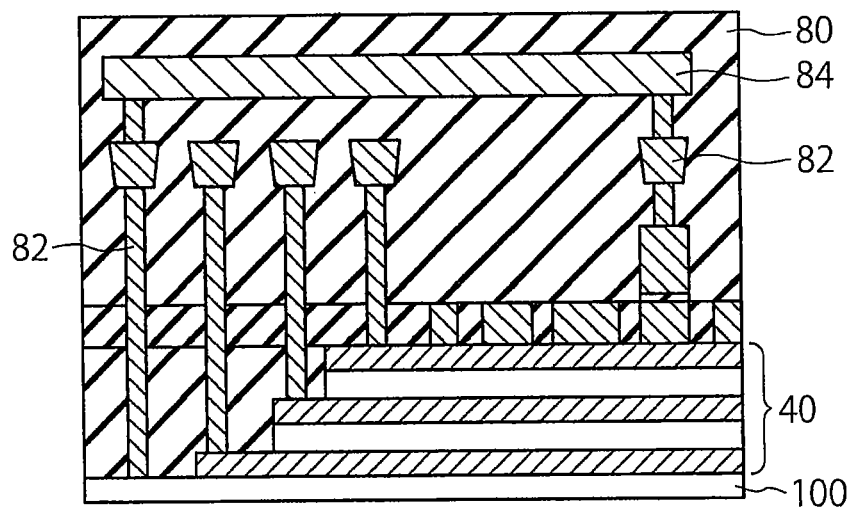
FIG. 19 is a sectional view for explaining a manufacturing method of the magnetic memory according to the first embodiment.

Then, an interlayer insulation film 80 is formed. In this interlayer insulation film, vias respectively communicating with the writing and reading unit 30, the electrodes 41, 43 and 45 in the magnetization rotation drive unit 40, and the substrate 100, and an interconnection groove communicating with these vias is formed. Then, contacts 82 and an interconnection 84 are formed by burying the vias and the interconnection groove with metal, and a magnetic memory is completed (FIG. 19).

According to the first embodiment described heretofore, it is possible to achieve a shift register type magnetic memory which conducts a sure shift operation every bit even in the case where information of at least one hundred bits is handled. As a result, an inexpensive, highly reliable, large capacity memory can be obtained.

In the case where the magnetization rotation drive unit 40 having the piezoelectric devices is used in the first embodiment as shown in FIGS. 7(a) and 7(b), a magnetic wall movement operation using voltage control instead of current control becomes possible. As a result, power dissipation required for the movement operation can be reduced.

In the case where the magnetization rotation drive unit 50 shown in FIGS. 9(a) to 9(e) is used, the spin torque transfer from a pair of the magnetic material members 52 and 54 is used. As a result, a thermal process for forming the piezoelectric device becomes unnecessary and it is possible to conduct the manufacture in a temperature zone suitable for forming the magnetic film. Therefore, reliability improvement owing to cost reduction of the process and expansion of the degree of freedom in design of the magnetic film can be anticipated.

Furthermore, unlike the conventional race track memory, it is not necessary to provide a current inlet port and takeout port for the magnetic nanowire. Therefore, cueing of data after data reading and temporary storage of data into a buffer formed separately become unnecessary. It becomes possible to read or write while retaining data in a torus form. As a result, a large capacity memory of low power dissipation can be implemented at lower cost.

(Material of Magnetic Nanowire 10)

The magnetic nanowire 10 is formed of, for example, a single metal or an alloy including at least one element selected from a group composed of iron (Fe), cobalt (Co), nickel (Ni), manganese (Mn) and chromium (Cr). A magnetic alloy including at least one element selected from the group can be used. For example, permalloy (NiFe alloy) and a CoFe alloy can be mentioned as examples.

Furthermore, as the magnetic nanowire 10, a magnetic material which has a large uniaxial anisotropy constant Ku and which exhibits vertical magnetic anisotropy can also be used as occasion demands. If a material having a large uniaxial anisotropy constant Ku is used, the magnetic wall width obtained when a magnetic field or a current is not given is narrow. If a material having a large uniaxial anisotropy constant Ku is used as the magnetic nanowire in the present embodiment, an effect that the magnetic wall width expands when a magnetic field is given is apt to be obtained. As an example of such a material, there is an alloy including at least one element selected from a group composed of Fe, Co, Ni, Mn and Cr and at least one element selected from a group composed of Pt, Pd, Ir, Ru and Rh. The value of the uniaxial anisotropy constant can also be adjusted by using the composition of magnetic materials contained in the magnetic nanowire 10 or crystal regularity caused by heat processing.

Furthermore, as the magnetic nanowire 10, a magnetic material which has a crystal structure of an hcp (hexagonal close-packed) structure and which exhibits vertical magnetic anisotropy can be used. For example, a material including metal having Co as a main component can be used as the magnetic nanowire 10. It is also possible to use another metal having an hcp structure, such as CoPt or a hard magnetic material obtained by adding an additive element to CoPt. Furthermore, it is also possible to use FePt or a hard magnetic material obtained by adding an additive element to FePt.

The direction of the magnetization in the magnetic nanowire 10 may be substantially perpendicular to or substantially parallel to the direction of the extension of the magnetic nanowire. If the direction of the magnetization in the magnetic nanowire 10 is substantially perpendicular to the direction of the extension of the magnetic nanowire, a current value at the time when writing magnetization via a MTJ (Magnetic Tunnel Junction) element can be reduced.

Furthermore, Co, CoPt alloy, or CoCrPt alloy can be used as the magnetic nanowire 10. In these materials, the magnetic anisotropy is large and the axis of easy magnetic anisotropy is in the film face. These materials are metal crystals having a c axis of the hcp structure in the film face. Materials obtained by adding an additive element to the above-described materials can also be used.

Furthermore, a Co layer, a CoPt layer, a FePt layer, a (Co/Ni) stacked layer, or a TbFe layer can be used as the magnetic nanowire 10. By the way, CoPt can be an alloy. In these materials, the c axis of the hcp structure is in the direction perpendicular to the film face. If Tb is in the range of 20 atomic % to 40 atomic % in the case of the TbFe layer, then the TbFe layer exhibits the vertical anisotropy. In addition, materials obtained by adding an additive element to the above-described materials can also be used.

Furthermore, a material which is an alloy of a rare-earth element and a iron group transition element, and which indicates vertical magnetic anisotropy can also be used as the magnetic nanowire 10. For example, at least one of GdFe, GdCo, GdFeCo, TbFe, TbCo, TbFeCo, GdTbFe, GdTbCo, DyFe, DyCo and DyFeCo can be used.

Materials obtained by adding a non-magnetic element of at least one of Ag, Cu, Au, Al, Mg, Si, Bi, Ta, B, C, O, N, Pd, Pt, Zr, Ir, W, Mo, Nb and H to the above-described materials can be used as the magnetic nanowire 10. Magnetic characteristics can be adjusted by addition of these non-magnetic elements. Various properties such as a crystal property, mechanical characteristics, or chemical characteristics can be adjusted by addition.

(Material of Ferromagnetic Films 4)

The ferromagnetic films 4 can contain, for example, at least one of magnetic oxide, magnetic nitride, and magnetic oxynitride. As the iron oxide, $Fe_3O_4$, $Y-Fe_2O_3$, and $\alpha\text{-}Fe_2O_3$, those with an additive element added, or those with iron nitride or an additive element added can be mentioned. $CoFe_2O_4$, $NiFe_2O_4$, $MnFe_2O_4$ and $CrFe_2O_4$ can also be mentioned. As for the magnetic oxide, a magnetic oxide having a spinel crystal structure is easy to use practically because it is high in Curie temperature in many cases. Furthermore, they are easy to use, because the magnetostriction constant can also be changed by changing the additive element.

Furthermore, the ferromagnetic films 4 can contain at least one of an oxide containing at least one of Fe, Co and Ni, a nitride containing at least one of Fe, Co and Ni, and an oxynitride containing at least one of Fe, Co and Ni.

It is desirable that the absolute value of the magnetostriction constant ($\lambda s$) of the ferromagnetic films 4 is at least $10^{-5}$. As a result, strain generated in the ferromagnetic film by a stress applied by the magnetization rotation drive unit rotates magnetic domains efficiently. The magnetostriction constant ($\lambda s$) indicates magnitude of a shape change caused when an external magnetic field is applied and the ferromagnetic films 4 are subjected to saturation magnetization in a certain direction. If the length is L in a state without an external magnetic field and the length changes by $\Delta L$ in a state in which the external magnetic field is applied, the magnetostriction constant $\lambda s$ is represented as $\Delta L/L$. This change value changes depending upon the magnitude of the external magnetic field. The magnetostriction constant $\lambda s$ is represented by $\Delta L/L$ in the state in which a sufficient external field is applied and the magnetization is saturated.

In the foregoing description, high magnetostriction constant films obtained by oxidizing the same material as that of the magnetic nanowire can be used for the ferromagnetic films 4. As described in the manufacturing method, however, it is also possible to form the ferromagnetic films 4 by deposition using plating separately from the magnetic nanowire 10. In this case, the ferromagnetic films 4 are not restricted to oxides or nitrides, but may be metal or an alloy.

According to the first embodiment, it is possible to provide a highly reliable, low power dissipation, shift register type magnetic memory as described heretofore. The shift register type magnetic memory is inexpensive, and a large capacity can be obtained.

(Second Embodiment)

Figure 20:
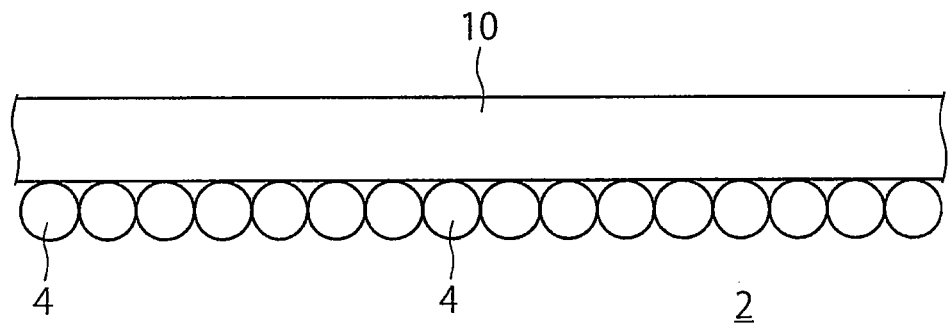
FIG. 20 is a plane view showing a magnetic memory according to a second embodiment.

A plane view of a shift register type magnetic memory according to a second embodiment is shown in FIG. 20. The magnetic memory according to the second embodiment includes a magnetic material chain 2 having a plurality of ferromagnetic films 4 arranged in a chain form, a magnetic nanowire 10, and a magnetization rotation drive unit which is not illustrated. As the magnetization rotation drive unit, the magnetization rotation drive unit 40 shown in FIGS. 7(a) and 7(b) or the magnetization rotation drive unit 50 shown in FIGS. 9(a) to 9(e) is used.

In the first embodiment, the magnetic nanowire 10 is provided in the torus form to surround the side faces of the magnetic material chain. In the second embodiment, however, the magnetic nanowire 10 is not provided in the torus form, but is extended in one direction. And the magnetic material chain is provided along one of side faces of the magnetic nanowire 10.

In the second embodiment as well, it is possible to provide a highly reliable, low power dissipation, shift register type magnetic memory in the same way as the first embodiment. The shift register type magnetic memory is inexpensive, and a large capacity can be obtained.

(Third Embodiment)

Figure 21:
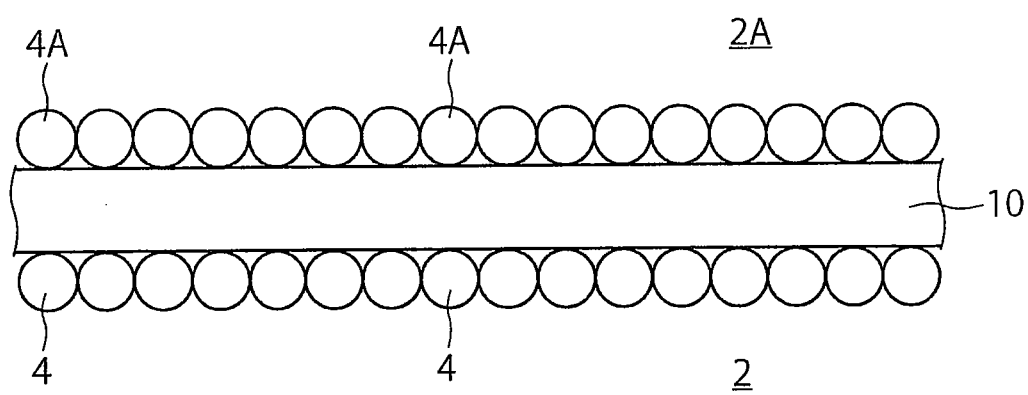
FIG. 21 is a plane view showing a magnetic memory according to a third embodiment.

A plane view of a shift register type magnetic memory according to a third embodiment is shown in FIG. 21. The magnetic memory according to the third embodiment has a configuration obtained by providing a magnetic material chain 2A along the other of the side faces of the magnetic nanowire 10 in the second embodiment. The magnetic material chain 2A includes a plurality of ferromagnetic films 4A arranged in a chain form. And the magnetic memory further includes a magnetization rotation drive unit (not illustrated) which drives and rotates magnetization of the ferromagnetic films 4A in the magnetic material chain 2A. As the magnetization rotation drive unit, the magnetization rotation drive unit 40 shown in FIGS. 7(a) and 7(b) or the magnetization rotation drive unit 50 shown in FIGS. 9(a) to 9(e) is used.

In the third embodiment, the rotation direction of magnetization of the ferromagnetic films 4 included in the magnetic material chain 2 is made opposite to the rotation direction of magnetization of the ferromagnetic films 4A included in the magnetic material chain 2A in order to move the magnetic walls in the magnetic nanowire 10. For example, if the rotation direction of the magnetization of the ferromagnetic films 4 is counterclockwise, then the rotation direction of the magnetization of the ferromagnetic films 4A becomes clockwise.

In the third embodiment as well, it is possible to provide a highly reliable, low power dissipation, shift register type magnetic memory in the same way as the second embodiment. The shift register type magnetic memory is inexpensive, and a large capacity can be obtained.

The technique for moving the magnetic walls described in the first to third embodiments can be applied to circuits other than the shift register type magnetic memory as well.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A shift register type magnetic memory comprising:
   a magnetic nanowire;
   a magnetic material chain provided in close vicinity to the magnetic nanowire, the magnetic material chain including a plurality of disk-shaped ferromagnetic films arranged along a direction in which the magnetic nanowire extends;
   a magnetization rotation drive unit configured to rotate and drive magnetization of the plurality of ferromagnetic films;
   a writing unit configured to write magnetic information into the magnetic nanowire; and
   a reading unit configured to read magnetic information from the magnetic nanowire.

2. The shift register type magnetic memory according to claim 1, wherein the magnetization rotation drive unit rotates and drives magnetization of the ferromagnetic films included in the magnetic material chain to move magnetic walls in the magnetic nanowire.

3. The shift register type magnetic memory according to claim 1, further comprising a non-magnetic layer provided between the magnetic nanowire and the plurality of ferromagnetic films.

4. The shift register type magnetic memory according to claim 1, wherein the magnetic material chain is provided on side of one of side faces of the magnetic nanowire along a direction in which the magnetic nanowire extends.

5. The shift register type magnetic memory according to claim 1, wherein the magnetic material chain comprises a first chain unit including a plurality of disk-shaped first ferromagnetic films provided on side of one of side faces of the magnetic nanowire along a direction in which the magnetic nanowire extends and a second chain unit including a plurality of disk-shaped second ferromagnetic films provided on side of the other of side faces of the magnetic nanowire along a direction in which the magnetic nanowire extends.

6. The shift register type magnetic memory according to claim 5, wherein
the magnetization rotation drive unit comprises a first drive unit configured to rotate and drive magnetization of the first ferromagnetic films in the first chain unit and a second drive unit configured to rotate and drive magnetization of the second ferromagnetic films in the second chain unit, and
a rotation direction of magnetization of the first ferromagnetic films driven by the first drive unit and a rotation direction of magnetization of the second ferromagnetic films driven by the second drive unit are opposite to each other.

7. The shift register type magnetic memory according to claim 1, wherein the magnetic nanowire takes a shape of a ring which surrounds periphery of the magnetic material chain.

8. The shift register type magnetic memory according to claim 1, wherein
the magnetization rotation drive unit comprises a stress application unit configured to apply a stress to the ferromagnetic films in the magnetic material chain, and
the stress application unit rotates and drives magnetization of the plurality of ferromagnetic films by applying a stress to the ferromagnetic films.

9. The shift register type magnetic memory according to claim 8, wherein the stress application unit comprises first and second piezoelectric devices which apply stresses in different directions with respect to an axis of easy magnetization of the ferromagnetic films in the magnetic material chain.

10. The shift register type magnetic memory according to claim 9, wherein
the first piezoelectric device applies a stress in a direction obtained by rotating the axis of easy magnetization of the ferromagnetic films in the magnetic material chain by an angle in a range of 50 to 80 degrees clockwise, and
the second piezoelectric device applies a stress in a direction obtained by rotating the axis of easy magnetization of the ferromagnetic films in the magnetic material chain by an angle in a range of 50 to 80 degrees counterclockwise.

11. The shift register type magnetic memory according to claim 9, wherein
the first piezoelectric device comprises a first electrode, a first piezoelectric material provided on the first electrode, and a second electrode provided on the first piezoelectric material, and
the second piezoelectric device comprises a second piezoelectric material provided on the second electrode, and a third electrode provided on the second piezoelectric material.

12. The shift register type magnetic memory according to claim 11, wherein the magnetic material chain and the magnetic nanowire are provided on the third electrode.

13. The shift register type magnetic memory according to claim 8, wherein a magnetostriction constant of the ferromagnetic films in the magnetic material chain is at least $10^{-5}$.

14. The shift register type magnetic memory according to claim 13, wherein a magnetostriction constant of the magnetic nanowire is less than that of the ferromagnetic films.

15. The shift register type magnetic memory according to claim 1, wherein
the magnetization rotation drive unit comprises first and second magnetic material members respectively having different magnetization directions with respect to an axis of easy magnetization of the ferromagnetic films in the magnetic material chain, and flows a current into the magnetic material chain through the first and second magnetic material members.

16. The shift register type magnetic memory according to claim 1, wherein the writing unit comprises a magnetic electrode and an intermediate layer provided between the magnetic nanowire and the magnetic electrode.

17. The shift register type magnetic memory according to claim 1, wherein the reading unit comprises a magnetic electrode having a fixed magnetization direction and a tunnel barrier layer provided between the magnetic nanowire and the magnetic electrode.

18. The shift register type magnetic memory according to claim 1, wherein the reading unit comprises a detection line to detect induced electromotive force when magnetic walls in the magnetic nanowire move.

19. The shift register type magnetic memory according to claim 1, wherein the reading unit comprises a spin wave transmission line to detect magnetization of the magnetic nanowire as a spin wave signal.

20. The shift register type magnetic memory according to claim 1, wherein the plurality of ferromagnetic films in the magnetic material chain, non-magnetic layers are provided between adjacent ferromagnetic films.

* * * * *